United States Patent
Uchida

(10) Patent No.: US 10,719,867 B2
(45) Date of Patent: Jul. 21, 2020

(54) BATTERY REPLACEMENT ASSISTING SYSTEM AND SERVER USED FOR SAME

(71) Applicant: TOYOTA JIDOSHA KABUSHIKI KAISHA, Toyota-shi, Aichi-ken (JP)

(72) Inventor: Masatoshi Uchida, Toyota (JP)

(73) Assignee: TOYOTA JIDOSHA KABUSHIKI KAISHA, Toyota-shi, Aichi-ken (JP)

(*) Notice: Subject to any disclaimer, the term of this patent is extended or adjusted under 35 U.S.C. 154(b) by 290 days.

(21) Appl. No.: 15/851,904

(22) Filed: Dec. 22, 2017

(65) Prior Publication Data

US 2018/0222343 A1 Aug. 9, 2018

(30) Foreign Application Priority Data

Feb. 7, 2017 (JP) .................. 2017-020316

(51) Int. Cl.
*G06Q 30/06* (2012.01)
*B60L 11/18* (2006.01)
(Continued)

(52) U.S. Cl.
CPC ...... *G06Q 30/0631* (2013.01); *B60L 11/1857* (2013.01); *B60L 53/64* (2019.02); *B60L 53/665* (2019.02); *B60L 53/80* (2019.02); *B60L 58/16* (2019.02); *B60W 10/26* (2013.01); *G01R 31/374* (2019.01); *G01R 31/3842* (2019.01); *G01R 31/392* (2019.01);
(Continued)

(58) Field of Classification Search
CPC ........... G06Q 30/0601; G06Q 30/0613; G06Q 30/0627; G06Q 30/0629; G06Q 30/0631; G06Q 30/0635; G06Q 30/0641; B60L 11/1857; B60L 58/16; G01R 31/392; Y02L 90/14
USPC .. 705/26.41, 26.63, 26.64, 26.7, 26.81, 27.1
See application file for complete search history.

(56) References Cited

U.S. PATENT DOCUMENTS 8,204,702 B2 * 6/2012 Center ................. G01R 31/392
702/63
10,017,069 B2 * 7/2018 Lim ..................... H02J 7/0021
(Continued)

FOREIGN PATENT DOCUMENTS

EP 3333780 A1 6/2018
JP 2002133032 A 5/2002
(Continued)

*Primary Examiner* — Yogesh C Garg
(74) *Attorney, Agent, or Firm* — Sughrue Mion, PLLC

(57) ABSTRACT

A battery replacement assisting system includes a server configured to determine, from a plurality of battery packs including a recycled battery pack, a battery pack serving as a replacement candidate for a battery pack mounted on the vehicle. The server is configured to: acquire a state of deterioration of the battery pack; select a battery pack having a life longer than a period until the planned time from the plurality of battery packs by calculating a distance (life) in which the vehicle can travel until a capacity maintenance ratio of the battery pack reaches a threshold value (Qth); and determine the replacement candidate using a result of the selection and the expense information. The battery replacement assisting system further includes a display configured to notify the user of the replacement candidate determined by the server and the expense information of the replacement candidate.

6 Claims, 24 Drawing Sheets

(51) Int. Cl.
*B60W 10/26* (2006.01)
*G01R 31/374* (2019.01)
*G01R 31/392* (2019.01)
*G01R 31/3842* (2019.01)
*G06Q 10/06* (2012.01)
*B60L 53/80* (2019.01)
*B60L 53/64* (2019.01)
*B60L 53/66* (2019.01)
*B60L 58/16* (2019.01)

(52) U.S. Cl.
CPC ....... *G06Q 10/063* (2013.01); *G06Q 30/0601* (2013.01); *G06Q 30/0613* (2013.01); *G06Q 30/0627* (2013.01); *G06Q 30/0629* (2013.01); *G06Q 30/0635* (2013.01); *G06Q 30/0641* (2013.01); *Y02T 10/7005* (2013.01); *Y02T 10/7055* (2013.01); *Y02T 10/7072* (2013.01); *Y02T 90/121* (2013.01); *Y02T 90/124* (2013.01); *Y02T 90/128* (2013.01); *Y02T 90/14* (2013.01); *Y02T 90/163* (2013.01); *Y02T 90/169* (2013.01); *Y04S 30/14* (2013.01)

(56) References Cited

U.S. PATENT DOCUMENTS

| | | | | |
|---|---|---|---|---|
| 2003/0137277 | A1* | 7/2003 | Mori | G01R 31/3648 320/132 |
| 2007/0029974 | A1* | 2/2007 | Uchida | G01R 31/3842 320/132 |
| 2008/0105475 | A1* | 5/2008 | Hu | B60K 6/105 180/65.1 |
| 2011/0000721 | A1* | 1/2011 | Hassett | B60K 6/48 180/65.22 |
| 2012/0101755 | A1* | 4/2012 | Hirasawa | H01M 10/48 702/63 |
| 2013/0200902 | A1 | 8/2013 | Kurimoto | |
| 2014/0171260 | A1* | 6/2014 | Dalum | B60W 20/10 477/5 |
| 2016/0039542 | A1* | 2/2016 | Wang | B64F 1/18 701/2 |
| 2018/0010919 | A1* | 1/2018 | Huang | B60L 58/12 |

FOREIGN PATENT DOCUMENTS

| | | | |
|---|---|---|---|
| JP | 2007-074891 A | 3/2007 | |
| JP | 2010-014498 A | 1/2010 | |
| JP | 2010-045901 A | 2/2010 | |
| JP | 2010057339 A | 3/2010 | |
| JP | 2013-77054 A | 4/2013 | |
| JP | 2013-84198 A | 5/2013 | |
| JP | 2014041768 A | 3/2014 | |
| JP | 2014-072932 A | 4/2014 | |
| JP | 2016101084 A * | 5/2016 | ............. B60L 53/12 |
| JP | 5982066 A1 | 8/2016 | |
| WO | 2012049852 A1 | 4/2012 | |

* cited by examiner

FIG.4

<TRAVELING TIME RANK>

| | TRAVELING TIME | TARGET BATTERY PACK |
|---|---|---|
| A | < 3 YEARS | ● |
| B | 3 TO 6 YEARS | |
| C | 6 TO 10 YEARS | |
| D | ≥ 10 YEARS | |

<TRAVELING DISTANCE RANK>

| | TRAVELING DISTANCE | TARGET BATTERY PACK |
|---|---|---|
| A | < 50,000km | |
| B | 50,000km TO 100,000km | |
| C | 100,000km TO 150,000km | ● |
| D | ≥ 150,000km | |

<CAPACITY MAINTENANCE RATIO RANK>

| | CAPACITY MAINTENANCE RATIO | TARGET BATTERY PACK |
|---|---|---|
| A | ≥ 80% | |
| B | 50% TO 80% | ● |
| C | 20% TO 50% | |
| D | < 20% | |

FIG.5

<RECYCLED BATTERY PACK DATABASE>

| BATTERY ID | VEHICLE ID | TRAVELING TIME | TRAVELING DISTANCE | CAPACITY MAINTENANCE RATIO | GENERAL RANK | PRICE |
|---|---|---|---|---|---|---|
| | | B | C | B | C | |
| | | B | B | A | B | |
| | | C | D | D | D | |
| | | A | A | A | A | |
| | | ⋮ | ⋮ | ⋮ | ⋮ | |
| | | A | B | B | B | |

FIG.6
(A)
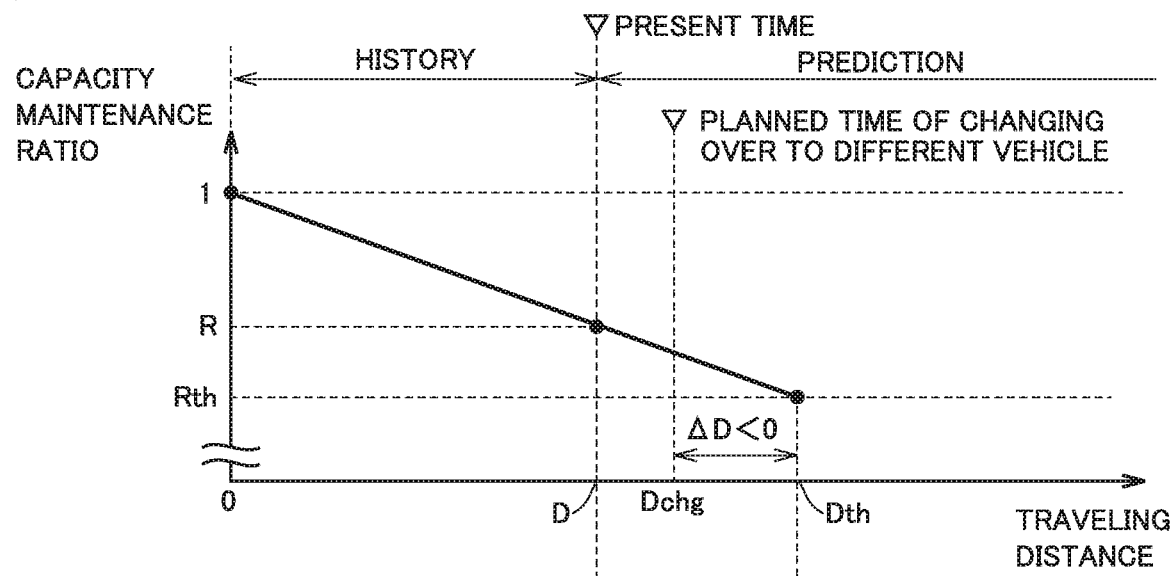
(B)
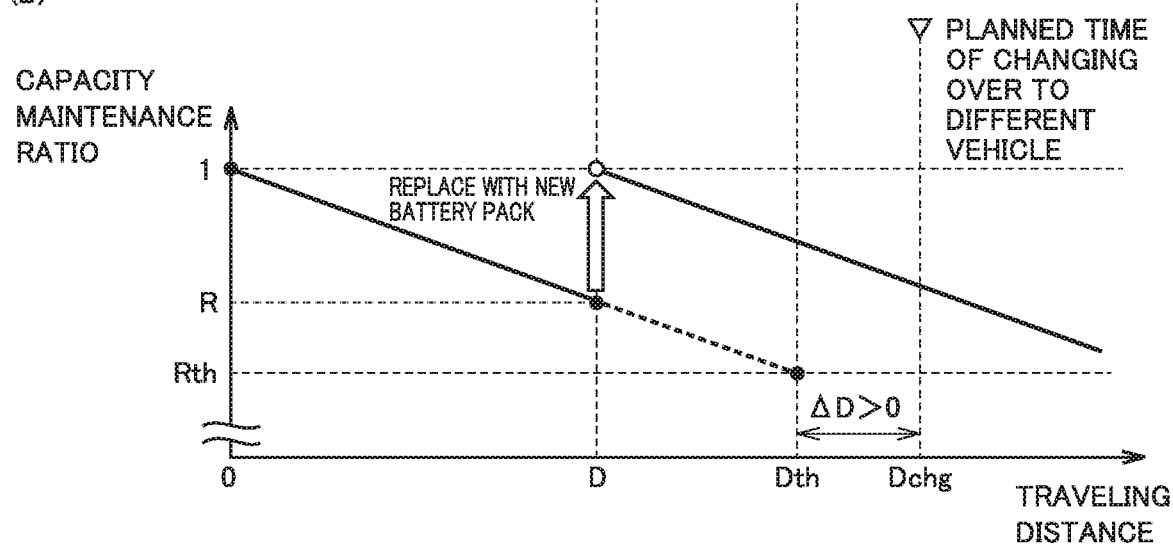

FIG.9
(A) REPLACEMENT WITH C RANK
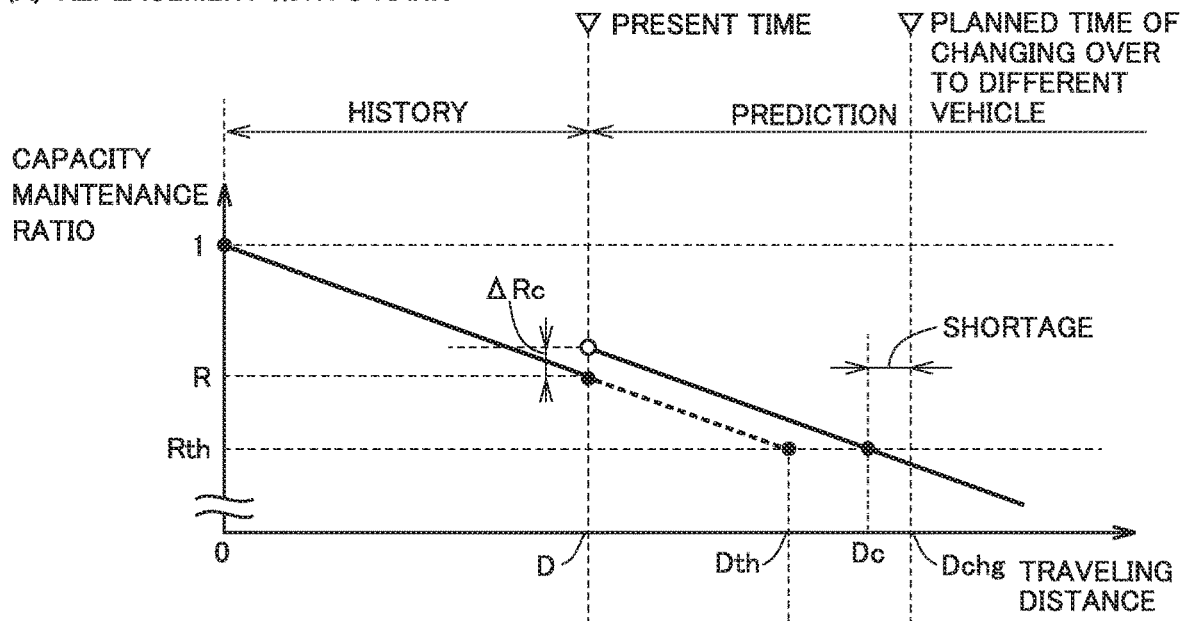
(B) REPLACEMENT WITH B RANK
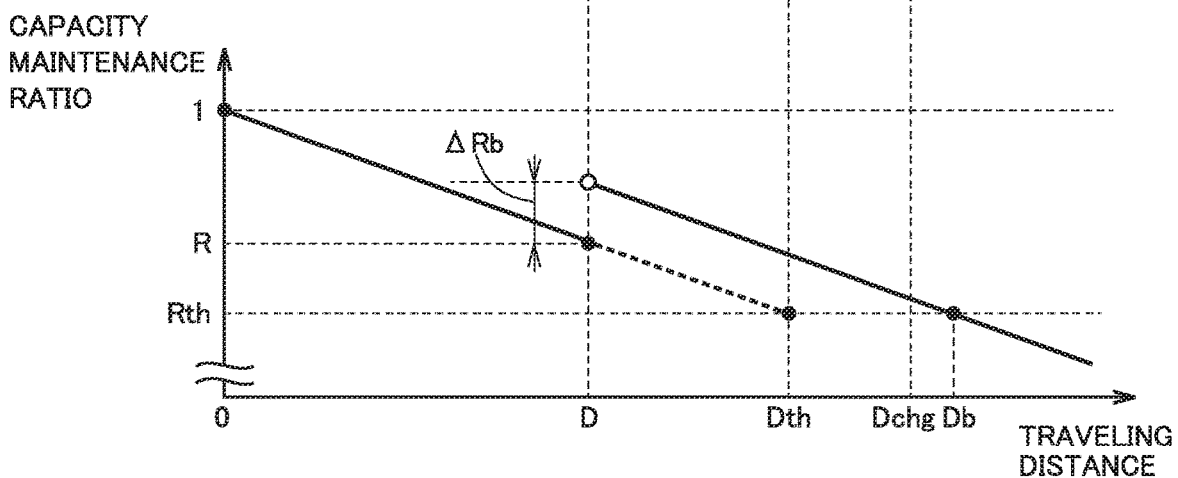

FIG.10A

IN VIEW OF YOUR PAST TRAVELING HISTORY, PREDICTED TRAVELING DISTANCE UNTIL XX (MONTH), XX (YEAR), WHICH IS PLANNED TIME OF CHANGING OVER TO DIFFERENT VEHICLE, IS XX km.

IF BATTERY FOR TRAVELING IS NOT REPLACED, REMAINING POSSIBLE TRAVELING DISTANCE IS XX km.

HENCE, REPLACEMENT OF BATTERY FOR TRAVELING SEEMS UNNECESSARY.

FIG.10B

IN VIEW OF YOUR PAST TRAVELING HISTORY, PREDICTED TRAVELING DISTANCE UNTIL XX (MONTH), XX (YEAR), WHICH IS PLANNED TIME OF CHANGING OVER TO DIFFERENT VEHICLE, IS XX km.

IF BATTERY FOR TRAVELING IS NOT REPLACED, REMAINING POSSIBLE TRAVELING DISTANCE IS XX km.

HENCE, IT IS RECOMMENDED TO REPLACE BATTERY FOR TRAVELING. IT SHOULD BE NOTED THAT PURCHASING PRICE FOR PRESENTLY USED BATTERY FOR TRAVELING IS XX JPY.

(1) IF BATTERY FOR TRAVELING IS REPLACED WITH NEW BATTERY:
   POSSIBLE TRAVELING DISTANCE IS EXTENDED BY XX km
   TO BE XX km.
     REPLACEMENT EXPENSE IS XX JPY.
     FUEL EXPENSE CAN BE SAVED BY XX JPY DUE TO IMPROVED FUEL EFFICIENCY.
     SUBSTANTIAL ACTUAL EXPENSE IS THEREFORE XX JPY.

(2) IF BATTERY FOR TRAVELING IS REPLACED WITH A RANK RECYCLED BATTERY:
   POSSIBLE TRAVELING DISTANCE IS EXTENDED BY XX km
   TO BE XX km.
     REPLACEMENT EXPENSE IS XX JPY.
     FUEL EXPENSE CAN BE SAVED BY XX JPY DUE TO IMPROVED FUEL EFFICIENCY.
     SUBSTANTIAL ACTUAL EXPENSE IS THEREFORE XX JPY.

(3) <RECOMMENDATION>
   IF BATTERY FOR TRAVELING IS REPLACED WITH B RANK RECYCLED BATTERY:
   POSSIBLE TRAVELING DISTANCE IS EXTENDED BY XX km
   TO BE XX km.
     REPLACEMENT EXPENSE IS XX JPY.
     FUEL EXPENSE CAN BE SAVED BY XX JPY DUE TO IMPROVED FUEL EFFICIENCY.
     SUBSTANTIAL ACTUAL EXPENSE IS THEREFORE XX JPY.

FIG.18
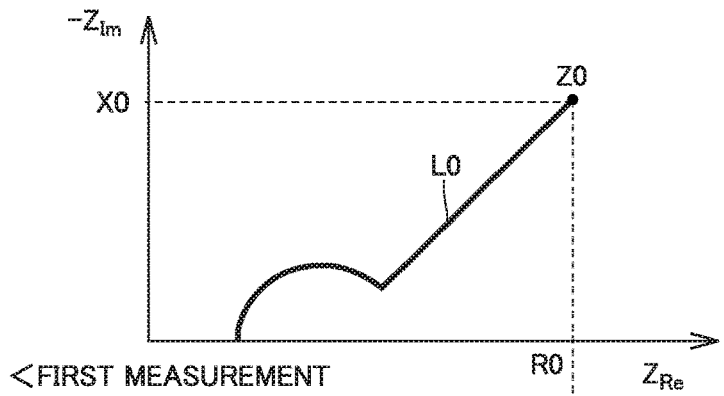
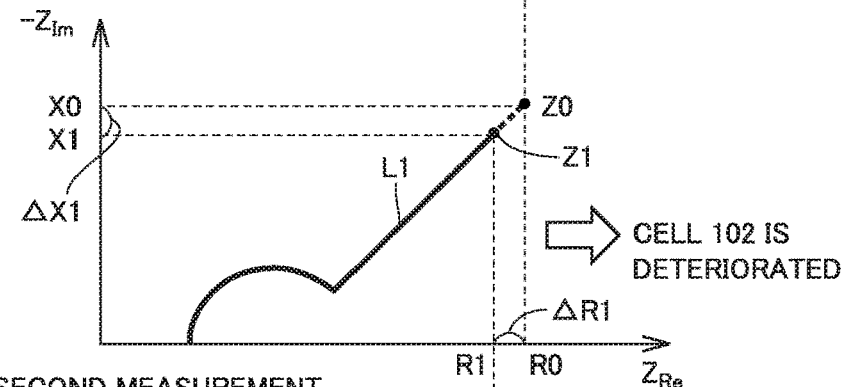
→ CELL 102 IS DETERIORATED
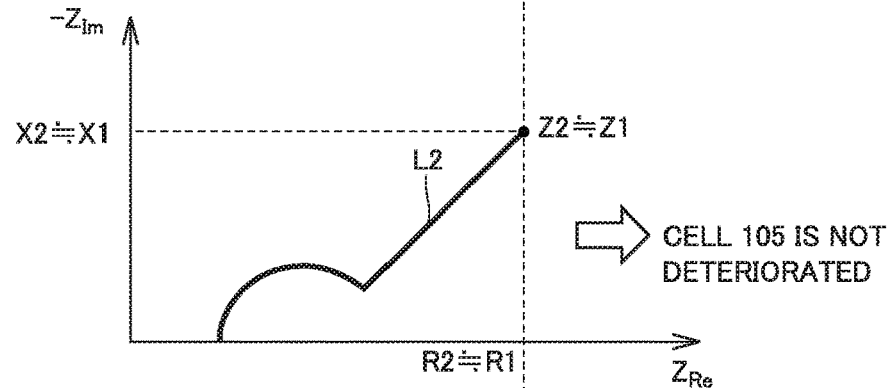
→ CELL 105 IS NOT DETERIORATED
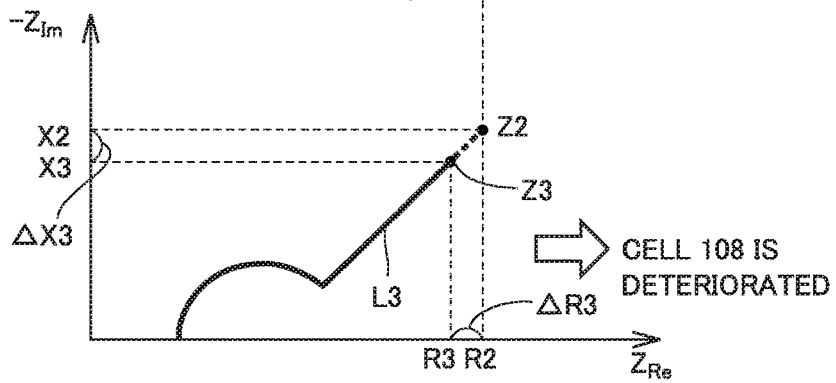
→ CELL 108 IS DETERIORATED

FIG.24

|   | | [ACTUALLY MEASURED VALUE] | [NORMAL VALUE] |
|---|---|---|---|
| 1. | *(MONTH) * (DAY), 2012 | 100% | 100% |
| 2. | *(MONTH) * (DAY), 2013 | 98% | 98% |
| 3. | *(MONTH) * (DAY), 2014 | 96% | 96% |
| 4. | *(MONTH) * (DAY), 2015 | 95% | 95% |
| 5. | *(MONTH) * (DAY), 2016 | 91% | 93% |

[NOTE]
DECREASE IN EV TRAVELING DISTANCE IS CONFIRMED.
PLEASE INSPECT VEHICLE AT NEARBY DEALER.

BATTERY REPLACEMENT ASSISTING SYSTEM AND SERVER USED FOR SAME

This nonprovisional application is based on Japanese Patent Application No. 2017-020316 filed on Feb. 7, 2017, with the Japan Patent Office, the entire contents of which are hereby incorporated by reference.

BACKGROUND

Field

The present disclosure relates to a battery replacement assisting system and a server used for the battery replacement assisting system, more particularly, a technique of assisting replacement of a secondary battery mounted on a vehicle.

Description of the Background Art

In recent years, hybrid vehicles (including plug-in hybrid vehicles), electric vehicles, and the like have been in practical use as vehicles that travel by consuming electrical energy. On each of these vehicles, a secondary battery for storing electric power for traveling is mounted.

The secondary battery is deteriorated through use or with passage of time. Therefore, the secondary battery needs to be inspected at an appropriate time. When the life of the secondary battery is expiring, it is desirable to replace the secondary battery. For example, Japanese Patent Laying-Open No. 2007-074891 discloses a device configured to calculate a remaining life of a secondary battery in accordance with a state of deterioration of the secondary battery and predict a time of replacement of the secondary battery based on the remaining life.

SUMMARY

For replacement of a secondary battery, a deteriorated secondary battery is removed from a vehicle and a different secondary battery is attached to the vehicle. For this different secondary battery, not only a new secondary battery but also a recycled (reused or rebuilt) secondary battery can be used.

Generally, states of deterioration of new and recycled secondary batteries differ among batteries. Therefore, a price (replacement expense) is defined for each of a plurality of secondary batteries in accordance with a state of deterioration of the secondary battery. Hence, from the point of view of a user, it is desirable that the user himself/herself can select an appropriate one from a plurality of secondary batteries in accordance with a plan of use of the vehicle in future.

More specifically, for example, when the user plans to continue to use the vehicle for a long time (or plans to travel a long distance) after the replacement of the secondary battery, the user can select a new secondary battery or a recycled secondary battery that is in a condition equivalent to that of a new secondary battery even if the replacement expense becomes relatively high. On the other hand, when the user plans to change over from the vehicle to a different vehicle or discard (disuse) the vehicle in near future, it is considered that the user can select a recycled battery pack deteriorated to some extent, thus reducing the replacement expense.

However, conventionally, no particular consideration has been taken in providing the user with information based on which the user can determine a desirable battery pack to be selected.

The present disclosure has been made to solve the problem above and has an object to provide a user with information for allowing the user to select an appropriate secondary battery in a battery replacement assisting system for replacing a secondary battery mounted on a vehicle.

Moreover, the present disclosure has another object to provide a user with information for allowing the user to select an appropriate secondary battery in a server used to assist replacement of a secondary battery mounted on a vehicle.

A battery replacement assisting system according to a certain aspect of the present disclosure is configured to assist replacement of a secondary battery mounted in a vehicle. The battery replacement assisting system includes: a console configured to accept an operation of a user with regard to a planned time of stopping use of a target vehicle (a planned time of changing over from the target vehicle to a different vehicle or a planned time of discarding the target vehicle); and a server configured to determine, from a plurality of secondary batteries including a recycled secondary battery, a secondary battery serving as a replacement candidate for a target battery mounted on the target vehicle. The server has deterioration information and expense information, the deterioration information being about a state of deterioration of each of the plurality of secondary batteries, the expense information being about an expense for replacement with each of the plurality of secondary batteries. The server is configured to: acquire a state of deterioration of the target battery; select a secondary battery having a life longer than a period until the planned time from the plurality of secondary batteries by calculating a life of the target battery representing at least one of a distance and a period in each of which the target vehicle is capable of traveling until the target battery reaches a predetermined state of deterioration; and determine the replacement candidate using a result of the selection and the expense information. The battery replacement assisting system further includes a notifier configured to notify the user of the replacement candidate determined by the server and the expense information of the replacement candidate.

A server according to another aspect of the present disclosure is configured to determine, from a plurality of secondary batteries including a recycled secondary battery, a secondary battery serving as a replacement candidate for a target battery mounted on a target vehicle, the secondary battery serving as the replacement candidate being determined using a planned time of stopping use of the target vehicle, the planned time being input by a user, the server being configured to provide a result of the determination to the user. The server includes a storage device, a calculation device, and a communication device. The storage device has deterioration information and expense information, the deterioration information being about a state of deterioration of each of the plurality of secondary batteries, the expense information being about an expense for replacement with each of the plurality of secondary batteries. The calculation device is configured to: acquire a state of deterioration of the target battery; select a secondary battery having a life longer than a period until the planned time from the plurality of secondary batteries by calculating a life of the target battery representing at least one of a distance and a period in each of which the target vehicle is capable of traveling until the target battery reaches a predetermined state of deterioration; and determine the replacement candidate using a result of the selection and the expense information. The communication device is configured to notify the user of the replacement candidate determined by the calculation device and the expense information of the replacement candidate.

According to the above-described configuration, the secondary battery having a life longer than the period until the planned time of stopping the use of the target vehicle is selected from the plurality of secondary batteries, and the selected secondary battery and the expense information in the case of selecting that secondary battery are notified to the user as the information of the replacement candidate. By selecting the secondary battery having a life longer than the period until the planned time, the target vehicle can be continued to be used until the planned time after the replacement of the target battery. Moreover, by using the expense information, the user can be avoided from selecting a secondary battery having a too long life (in other words, a too expensive secondary battery), thereby reducing the expense for replacement of the target battery. By selecting the replacement candidate based on the life and providing the user with the expense information in this way, the user can appropriately determine a desirable secondary battery for the replacement.

Preferably, the recycled secondary battery is provided with a lower rank as deterioration of the recycled secondary battery is more advanced. An expense according to the rank of the recycled secondary battery is defined in the expense information. The server is configured to select, from the plurality of secondary batteries, a secondary battery having a lowest rank of ranks of secondary batteries each having a life longer than the period until the planned time. The notifier is configured to notify the user of the secondary battery selected by the server and the expense information of the secondary battery selected by the server.

According to the above-described configuration, the secondary battery is selected which has the lowest rank of the ranks of secondary batteries each having a life longer than the period until the planned time. As the rank of the secondary battery is lower, the expense is lower. Hence, the user can reduce the replacement expense the most while maintaining the target vehicle to be in a usable state until the above-described planned time.

Preferably, the console is configured to permit the user to select one of a new secondary battery and the recycled secondary battery as the replacement candidate. The server is configured to select the secondary battery having the lowest rank when the user selects the recycled secondary battery.

According to the above-described configuration, a server process for selecting a rank is performed when the user selects the recycled secondary battery, whereas the server process is not performed when the user selects the new secondary battery. Accordingly, an arithmetic load on the server can be reduced.

Preferably, the server is configured to select a secondary battery having a second lowest rank when the server does not have information about the secondary battery having the lowest rank.

According to the above-described configuration, even when the server does not have the information about the secondary battery having the lowest rank, the user can be provided with the information about the secondary battery having the second lowest rank.

Preferably, the target vehicle is a hybrid vehicle configured to perform: HV traveling in which the target vehicle travels by an internal combustion engine combusting fuel; and EV traveling in which the target vehicle travels using power stored in the target battery. The server is configured to calculate, as the expense information of the replacement candidate, an expense of the fuel that is able to be saved by the replacement of the target battery, and further transmit a result of the calculation to the notifier.

By replacing the target battery, the possible EV traveling distance of the vehicle becomes long, whereby an expense of fuel corresponding to the extended distance can be saved. According to the above-described configuration, the user is notified of the expense of the fuel that can be saved by the replacement of the target battery. Thus, the user is notified of not only the replacement expense (expense to be paid by the user) but also the expense that can be saved (reduction of the expense to be paid), whereby in comprehensive consideration of the expense required for the replacement of the target battery, the user can determine a desirable secondary battery for the replacement.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 4 illustrates ranking of a battery pack.

FIG. 5 shows exemplary data (table) stored in a recycled battery pack database.

FIG. 6 illustrates processes of S220, S230 shown in FIG. 3 more in detail.

FIG. 9 illustrates a method (process of S261 in FIG. 8) of determining a rank of a battery pack replaceable with a presently used battery pack.

FIG. 10A shows exemplary information presented on a display of the terminal.

FIG. 10B shows another exemplary information presented on the display of the terminal.

FIG. 18 shows a complex impedance plot for illustrating exemplary measurement results of AC impedances.

FIG. 24 shows an exemplary message presented on a display when it is determined that an abnormality has occurred in the battery pack.

DESCRIPTION OF THE PREFERRED EMBODIMENTS

Figure 1:
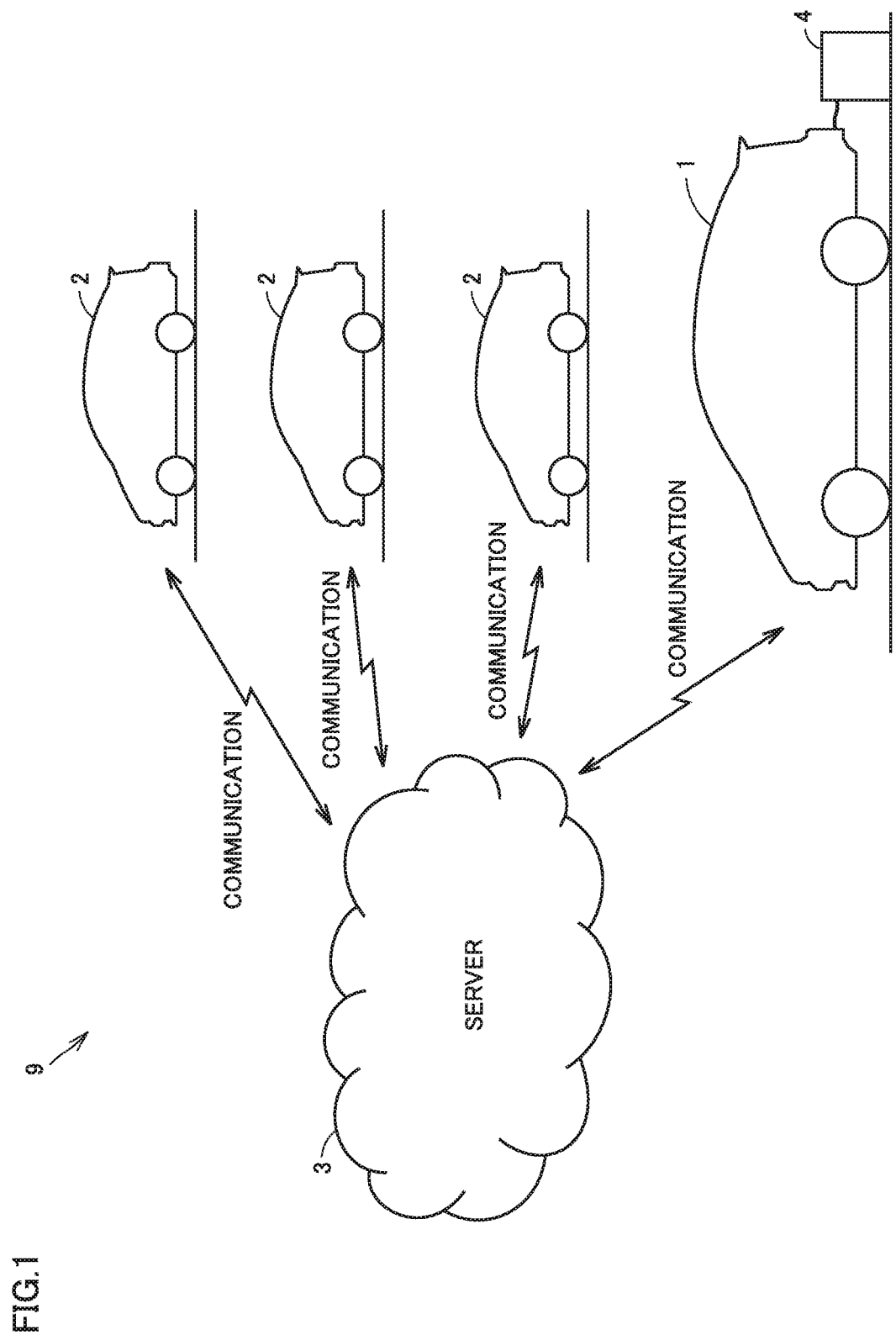
FIG. 1 schematically shows an entire configuration of a battery replacement assisting system according to a first embodiment.

The following describes embodiments of the present disclosure with reference to figures in detail. It should be noted that the same or corresponding portions are given the same reference characters and are not described repeatedly.

In the present disclosure, the term "vehicle" refers to a vehicle on which a secondary battery (battery pack) for traveling is mounted. More specifically, the term "vehicle" refers to a hybrid vehicle (inclusive of a plug-in hybrid vehicle that can be externally charged), an electric vehicle, and a fuel cell vehicle.

Recycling a battery pack is roughly divided into reuse and rebuilding. In the case of reuse, a collected battery pack is subjected to a shipment inspection and is then shipped as a reused battery pack without any modification (disassembly and repack). In the case of rebuilding, a collected battery pack is disassembled into cells, for example. Among the disassembled cells, cells usable without any modification are combined to produce a new battery pack. The newly produced battery pack is subjected to a shipment inspection and is shipped as a rebuilt battery pack. In the embodiments described below, the term "recycled (used) battery pack" encompasses a reused battery pack and a rebuilt battery pack.

First Embodiment

FIG. 1 schematically shows an entire configuration of a battery replacement assisting system according to a first embodiment. Battery replacement assisting system 9 includes: a user's vehicle 1 (target vehicle); a plurality of vehicles 2 other than vehicle 1; a server 3; and a battery information providing terminal (hereinafter, simply referred to as "terminal") 4. Vehicle 1 and server 3 are configured to communicate with each other. Likewise, each of the plurality of vehicles 2 and server 3 are also configured to communicate with each other.

In the first embodiment, as an exemplary situation of use of terminal 4, the following situation is assumed: the user hands over vehicle 1 to a dealer for inspection of vehicle 1 and terminal 4 is connected to vehicle 1. For example, when it is found that deterioration of battery pack 10 mounted on vehicle 1 is advanced to some extent as a result of the inspection, the user is requested to determine whether to replace battery pack 10. When battery pack 10 is determined to be replaced, the user is also requested to determine a battery pack to replace battery pack 10 from a plurality of battery packs including a new battery pack and a recycled battery pack.

Figure 2:
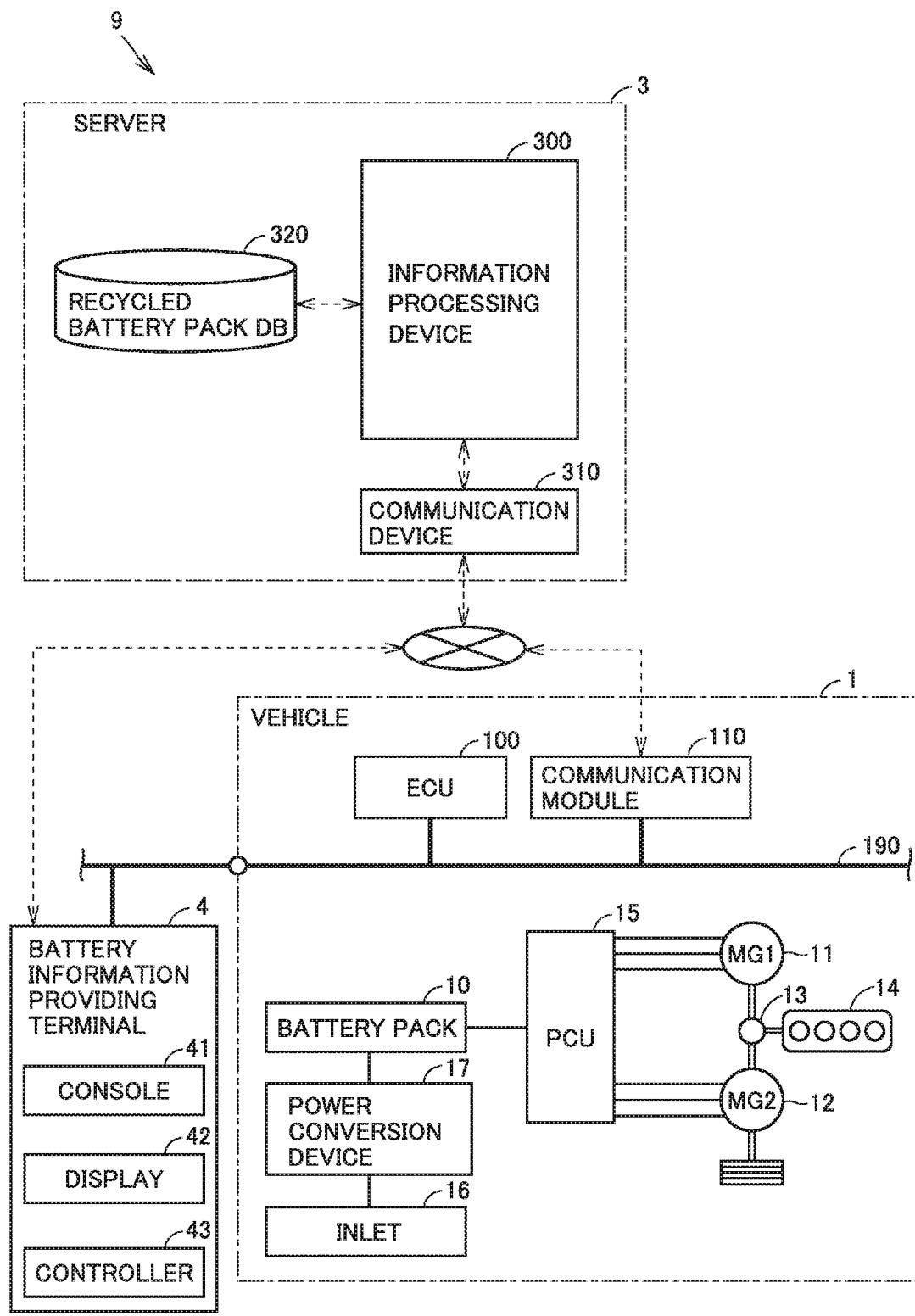
FIG. 2 shows the configuration of the battery replacement assisting system more in detail.

FIG. 2 shows the configuration of battery replacement assisting system 9 more in detail. In the first embodiment, each of vehicle 1 and the plurality of vehicles 2 is a plug-in hybrid vehicle. Since each of vehicles 2 has basically the same configuration as that of vehicle 1, FIG. 2 representatively shows the configuration of vehicle 1.

Vehicle 1 includes: a battery pack 10; motor generators (MG) 11, 12; a power split device 13; an engine 14; a power control unit (PCU) 15; an inlet 16; and a power conversion device 17.

Battery pack 10 is a battery pack including a plurality of lithium ion secondary battery cells, for example. Battery pack 10 supplies power for driving to motor generators 11, 12 through PCU 15.

Each of motor generators 11, 12 is a three-phase AC rotating electrical machine, for example. Motor generator 11 is connected to a crankshaft of an engine 14 via a power split device 13. When starting engine 14, motor generator 11 uses electric power of battery pack 10 to rotate the crankshaft of engine 14. Moreover, motor generator 11 is also capable of generating electric power using motive power of engine 14. The AC power generated by motor generator 11 is converted into DC power by PCU 15 to charge battery pack 10. Moreover, the AC power generated by motor generator 11 may be supplied to motor generator 12.

Motor generator 12 rotates the driving shaft using at least one of electric power stored in battery pack 10 and electric power generated by motor generator 11. Moreover, motor generator 12 can also generate electric power by way of regenerative braking. The AC power generated by motor generator 12 is converted into DC power by PCU 15 to charge battery pack 10.

PCU 15 includes an inverter and an converter (both not shown), and is configured to convert electric power among battery pack 10, motor generator 11, and motor generator 12.

Inlet 16 is configured to permit a plug (not shown) of a power cable to be coupled thereto. The power cable is used to supply power from a system power supply (not shown) to battery pack 10, and is used to supply power stored in battery pack 10 to a load (electric device (not shown) or the like that consumes power) provided outside vehicle 1. For example, power conversion device 17 is an AC/DC converter, and is configured to convert the voltage of the power supplied from the external power supply into a voltage suitable to store the power in battery pack 10, and is configured to convert the voltage of the power stored in battery pack 10 into a voltage that can be used by the load.

Vehicle 1 further includes an electronic control unit (ECU) 100 and a communication module 110. ECU 100 and communication module 110 are connected to each other via an in-vehicle LAN (Local Area Network) 190.

ECU 100 is configured to include a CPU (Central Processing Unit), a memory (ROM (Read Only Memory) and RAM (Random Access Memory)), and an input/output buffer (each not shown) ECU 100 is configured to control each of the devices (PCU 15, power conversion device 17, and the like) to bring vehicle 1 into a desired state. Moreover, ECU 100 is configured to monitor the voltage, current, and temperature of battery pack 10 and control charging/discharging of battery pack 10.

Vehicle 1 (ECU 100) is configured to communicate with server 3 via communication module 110. To server 3, vehicle 1 transmits: identification information (vehicle ID) including a vehicle type of vehicle 1; and information (deterioration information) about a state of deterioration of battery pack 10.

Server 3 includes an information processing device (calculation device) 300, a communication device 310, and a recycled battery pack database (storage device) 320.

Information processing device 300 is configured to include a CPU, a memory, and an input/output buffer (each not shown). Information processing device 300 is configured to perform various information processes with regard to replacement of battery pack 10 using data received from vehicle 1 or terminal 4 via communication device 310 and data stored in recycled battery pack database 320. Details of these processes will be described later.

Recycled battery pack database 320 stores data about recycled battery packs that were mounted on vehicles 2 in past and that can be mounted on vehicle 1 at present. The data may be collected directly from vehicles 2 using a communication function of each vehicle 2 as shown in FIG. 1. Alternatively, the data may be collected by removing a battery pack from a vehicle 2 and then making a performance evaluation (evaluation of a state of deterioration) on the battery pack. The data stored in recycled battery pack database 320 will be described in detail with reference to FIG. 4 and FIG. 5.

Generally, states of deterioration of new and recycled battery packs differ among battery packs. For each of battery packs to be used for replacement, a replacement expense (price) is defined in accordance with a state of deterioration of the battery pack. New battery packs are more expensive than recycled battery packs. Moreover, as described below, a recycled battery pack is provided with a rank in accordance with a state of deterioration of the recycled battery pack. Replacement expenses differ among respective ranks. Hence, from the point of view of the user of vehicle 1, it is desirable that the user himself/herself can select an appropriate one of new and recycled battery packs in accordance with a plan of use of the vehicle in future. Moreover, when a recycled battery pack is selected, it is desirable that an appropriate rank of recycled battery pack can be selected.

Therefore, in the present embodiment, information used for the user's determination in replacing battery pack 10 (hereinafter, also referred to as "presently used battery pack 10") mounted on vehicle 1 is provided by way of terminal 4. Hereinafter, this process will be referred to as "battery information providing process".

Terminal 4 includes a console 41, a display 42, and a controller 43. Console 41 accepts various user operations. Display (notifier) 42 presents various types of information for the purpose of notification to the user. Console 41 and display 42 are implemented by a touch-panel-equipped liquid crystal display, for example. Controller 43 is configured to include a CPU, a memory, and an input/output buffer (each not shown), and is configured to perform (a part of) the battery information providing process.

Terminal 4 is configured to be connectable to in-vehicle LAN 190 and communicate with ECU 100. Moreover, terminal 4 is also configured to communicate with server 3 via a communicator (not shown). It should be noted that terminal 4 is provided outside vehicle 1 in FIG. 2; however, terminal 4 may be mounted on vehicle 1.

Figure 3:
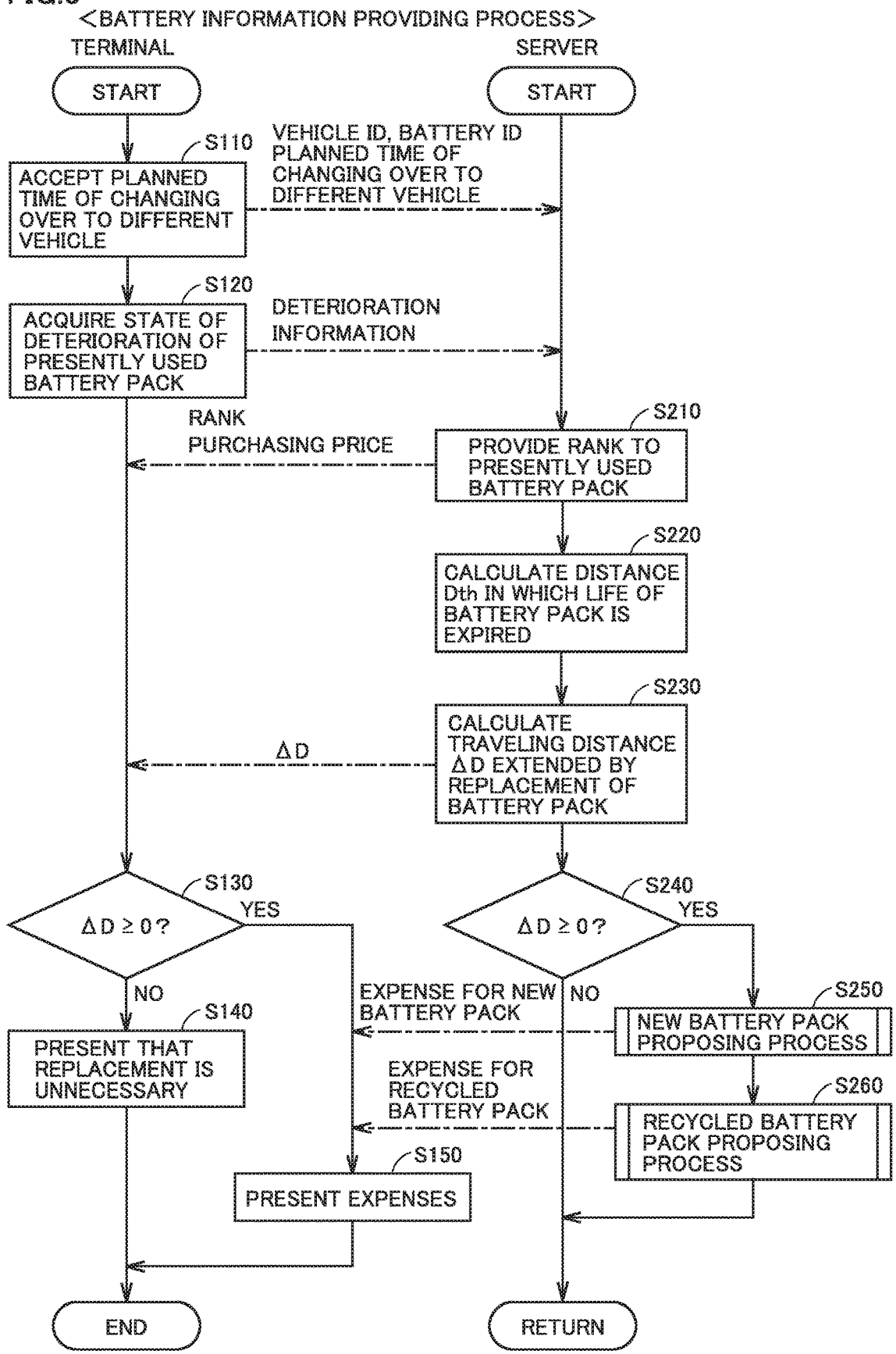
FIG. 3 is a flowchart for illustrating a battery information providing process in the first embodiment.

FIG. 3 is a flowchart for illustrating the battery information providing process in the first embodiment. The process of this flowchart is invoked from a main routine (not shown) and is executed in response to the user (or dealer or the like) operating console 41 of terminal 4.

Each of steps (hereinafter, abbreviated as "S") included in the flowcharts shown in FIG. 3 as well as FIG. 7, FIG. 8, and FIG. 11 described below is basically implemented by a software process by terminal 4 (more specifically, controller 43) or server 3 (more specifically, information processing device 300); however, a part or whole of the steps may be implemented by hardware (electric circuit) fabricated in terminal 4 or server 3. Moreover, the left-hand side of FIG. 3 shows a series of processes performed by terminal 4, and the right-hand side of FIG. 3 shows a series of processes performed by server 3.

With reference to FIG. 2 and FIG. 3, in S110, terminal 4 acquires, from ECU 100, vehicle ID and identification information (battery ID) about battery pack 10 mounted on vehicle 1. Further, terminal 4 acquires information about a time at which the user plans to change over from vehicle 1 to a different vehicle. More specifically, the user inputs a planned time of changing over to a different vehicle (not shown) by operating console 41. To server 3, terminal 4 transmits the vehicle ID, the battery ID, and the information about the planned time of changing over to a different vehicle. It should be noted that in the present embodiment, the change over from vehicle 1 to a different vehicle will be illustrated by way of example; however, a planned time of stopping use of vehicle 1 may be employed, such as a planned time of discarding (disusing) vehicle 1.

In the case of replacement of presently used battery pack 10, battery pack 10 removed from vehicle 1 is purchased by the dealer (or battery pack recycling business entity) for the purpose of recycling. Since a purchasing price (trade-in price) differs depending on a state of deterioration of battery pack 10, the state of deterioration of battery pack 10 is determined. More specifically, from ECU 100, terminal 4 acquires information (deterioration information) about the state of deterioration of battery pack 10 mounted on vehicle 1 (S120). For example, the deterioration information includes information about traveling time and traveling distance of vehicle 1 until the present time and a capacity maintenance ratio of battery pack 10. Since the deterioration information can be acquired by a well-known method (for example, see Patent Document 1), detailed description thereof will not be repeated. The deterioration information of battery pack 10 is transmitted to server 3.

In S210, server 3 provides a rank to presently used battery pack 10 based on the deterioration information of battery pack 10 from terminal 4. In accordance with this rank, the purchasing price is determined and a manner of recycling (reuse, rebuilding, or resource material recycling) is determined.

FIG. 4 illustrates ranking of a battery pack. For example, a recycled battery pack is ranked among four ranks A to D with regard to each of the following items: traveling time of a vehicle having the battery pack mounted thereon; a traveling distance of the vehicle; and a capacity maintenance ratio of the battery pack.

The A rank represents the highest rank corresponding to a state in which the battery pack is least deteriorated. The D rank is the lowest rank corresponding to a state in which the battery pack is most deteriorated. Such ranking is performed in advance onto each of the battery packs removed from the plurality of vehicles 2 for the purpose of recycling. A result thereof is stored in recycled battery pack database 320. It should be noted that a recycled battery pack having the A rank may be abbreviated as "A rank battery pack". The same applies to recycled battery packs having the B to D ranks.

FIG. 5 shows exemplary data (table) stored in recycled battery pack database 320. As fields, this table includes: a battery ID of a recycled battery pack; a vehicle ID of a vehicle having the battery pack mounted thereon; a traveling time of the vehicle; a traveling distance of the vehicle; a capacity maintenance ratio of the battery pack; a general rank; and a price.

For each rank of recycled battery packs, a different price is set in advance. The A rank of recycled battery packs are the most expensive (but are less expensive than new battery packs). The D rank of recycled battery packs are the most inexpensive. For example, with reference to the uppermost record in FIG. 5 by way of example, a certain battery pack is provided with the B rank for the traveling time, is provided with the C rank for the traveling distance, and is provided with the B rank for the capacity maintenance ratio. In this case, the general rank of this battery pack is determined as the C rank, which corresponds to the lowest one of the ranks for the above-described items.

Turning back to FIG. 3, server 3 provides a rank to presently used battery pack 10 and transmits the rank of battery pack 10 and the purchasing price of battery pack 10 to terminal 4 (S210). Further, server 3 performs: a process (S220) for calculating the life of battery pack 10; and a process (S230) for calculating a traveling distance to be extended by replacement of battery pack 10.

FIG. 6 illustrates the processes of S220 and S230 shown in FIG. 3 more in detail. In each of FIG. 6 and FIG. 9 below, the horizontal axis represents the traveling distance of vehicle 1, whereas the vertical axis represents the capacity maintenance ratio of battery pack 10. It should be noted that the horizontal axis may represent the traveling time of vehicle 1. Moreover, the vertical axis may represent the capacity of battery pack 10.

When presently used battery pack 10 is new (when the traveling distance is 0), the capacity maintenance ratio is 1. Then, the capacity maintenance ratio is decreased as the traveling distance is increased. The capacity maintenance ratio is R for traveling distance D at present.

Based on the past traveling history of vehicle 1 (history until the traveling distance becomes D from 0), it is possible to calculate a traveling distance Dth at which the capacity maintenance ratio will be decreased to a predetermined threshold value Rth (S220 in FIG. 3). Threshold value Rth is a capacity maintenance ratio at which battery pack 10 needs to be replaced. Therefore, it can be said that traveling distance Dth represents the life of battery pack 10.

Further, a traveling distance until the planned time of changing over to a different vehicle as input by the user in S110 of FIG. 3 can be also predicted based on the traveling history of vehicle 1. For example, when a yearly traveling distance (average of history values) for a certain user is about 10,000 km and the planned time of changing over to a different vehicle is two years after, a traveling distance in a period from the present time to the planned time of changing over to a different vehicle can be predicted to be about 20,000 km. It is assumed that the traveling distance upon the planned time of changing over to a different vehicle is represented by Dchg. Moreover, it is assumed that a difference between Dchg and Dth is represented by ΔD (=Dchg−Dth)

FIG. 6 (A) shows a case where difference ΔD in traveling distance has a negative value (a case where Dchg<Dth). In this case, even when the planned time of changing over from vehicle 1 to a different vehicle is reached, the life of presently used battery pack 10 highly likely remains (the capacity maintenance ratio is highly unlikely to be decreased to threshold value Rth). Therefore, it is considered that the replacement of battery pack 10 is not necessary.

On the other hand, FIG. 6 (B) shows a case where difference ΔD has a positive value (case where Dth<Dchg). In this case, the life of battery pack 10 is highly likely to be expired before changing over from vehicle 1 to a different vehicle, so that it is desirable to replace battery pack 10. If battery pack 10 is replaced with a new battery pack at the present time at which the traveling distance is D, the capacity maintenance ratio will be restored to about 1. As vehicle 1 is thereafter continued to be used, the traveling distance is increased and the capacity maintenance ratio is decreased.

Turning back to FIG. 3, difference ΔD in traveling distance is transmitted from server 3 to terminal 4 (S230). Terminal 4 determines whether difference ΔD has a positive value or a negative value. When difference ΔD has a negative value (NO in S130), terminal 4 controls display 42 to present that the replacement of battery pack 10 is unnecessary (S140). Moreover, when difference ΔD has a negative value (NO in S240), server 3 returns the process to the main routine.

On the other hand, when difference ΔD has a positive value or has a value of 0 (YES in S240), server 3 performs: a "new battery pack proposing process" (S250) for proposing, to the user, an expense or the like required for replacement of presently used battery pack 10 with a new battery pack; and a "recycled battery pack proposing process" (S260) for proposing, to the user, an expense or the like required for replacement of presently used battery pack 10 with a recycled battery pack. Server 3 transmits results of these processes to terminal 4. From server 3, terminal 4 receives the expenses or the like required for the replacement of battery pack 10 and controls display 42 to present them thereon (S150).

Figure 7:
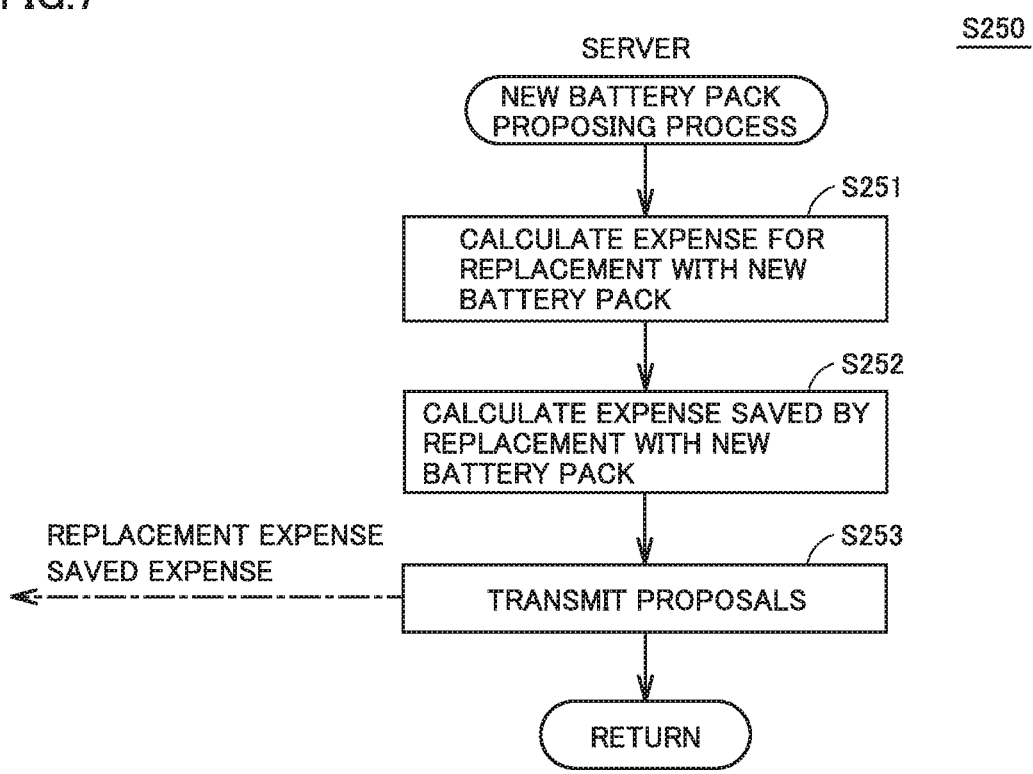
FIG. 7 is a flowchart for illustrating a new battery pack proposing process (process of S250 in FIG. 3) in detail.

FIG. 7 is a flowchart for illustrating the new battery pack proposing process (process of S250 in FIG. 3) in detail. In S251, server 3 calculates an expense for replacement with a new battery pack. This expense for replacement can be calculated based on a total of the price (material cost) of the new battery pack and a fee (labor cost) for operations required for the replacement of the battery pack, for example.

In vehicle 1, which is a plug-in hybrid vehicle, the possible EV traveling distance becomes shorter as battery pack 10 is more deteriorated; however, the possible EV traveling distance can be extended by replacing battery pack 10. For the longer (extended) possible EV traveling distance, an amount of fuel consumption can be suppressed, thereby saving an expense of purchasing fuel. Therefore, in S252, based on the extended traveling distance of vehicle 1 (difference ΔD in traveling distance) as predicted if presently used battery pack 10 is replaced with a new battery pack, server 3 calculates the expense of fuel that can be saved. In the description below, this expense of fuel that can be saved will be also referred to as "saved expense". In S252, server 3 calculates the saved expense in the case of replacement with a new battery pack.

For example, the saved expense can be calculated by $\Delta D \times +/C \times F$, where ΔD represents the difference in traveling distance (unit: km), α represents a dimensionless coefficient according to a ratio of an EV traveling distance to the whole of the past traveling distance of vehicle 1, C represents a fuel efficiency (history value of the fuel efficiency of vehicle 1) (unit: km/L) of vehicle 1, and F represents a fuel expense (estimate value of fuel expense in future) (unit: JPY/L).

In S253, server 3 transmits the replacement expense calculated in S251 and the saved expense calculated in S252 to terminal 4.

Figure 8:
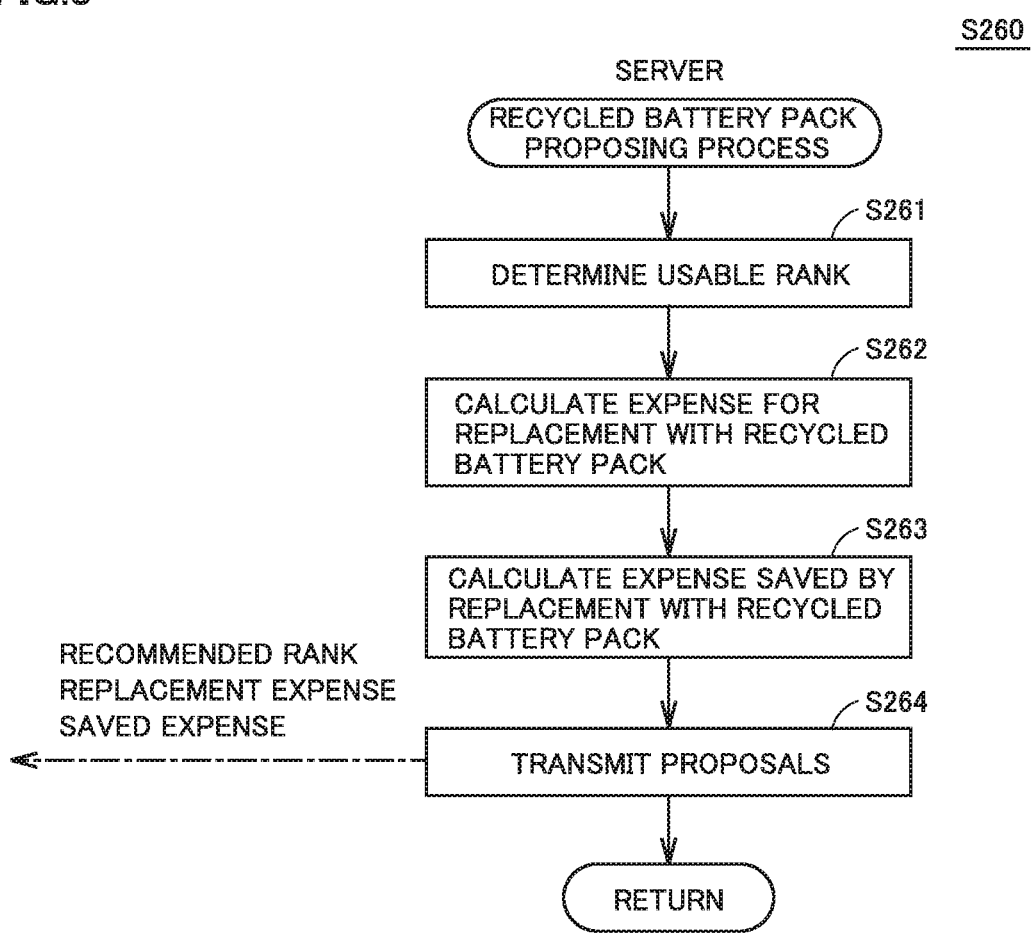
FIG. 8 is a flowchart for illustrating a recycled battery pack proposing process (process of S260 in FIG. 3) in detail.

FIG. 8 is a flowchart for illustrating the recycled battery pack proposing process (process S260 of FIG. 3) in detail. In S261, from the A to D ranks of recycled battery packs, server 3 determines a rank of battery pack replaceable with presently used battery pack 10. Further, in S262, server 3 calculates an expense for replacement with the rank of battery pack determined in S261. In S263, server 3 calculates the saved expense in the case of the replacement with the above-described battery pack. Then, in S264, server 3 transmits, to terminal 4, the rank (recommended rank) of battery pack determined in S261, the replacement expense calculated in S262, and the saved expense calculated in S263.

FIG. 9 illustrates the method (process of S261 in FIG. 8) of determining the rank of battery pack replaceable with presently used battery pack 10. FIG. 9 (A) shows an example of replacing the presently used battery pack with a C rank battery pack. In this case, an amount (amount of restoration) of increase ΔRc of the capacity maintenance ratio by the replacement of battery pack 10 is relatively small. Therefore, the capacity maintenance ratio may reach threshold value Rth before the planned time of changing over to a different vehicle (Dc<Dchg, where Dc represents the traveling distance at the point of time at which the capacity maintenance ratio reaches threshold value Rth). Therefore, it is not desirable to select the C rank battery pack.

FIG. 9 (B) shows an example of replacing the presently used battery pack with a B rank battery pack. In this case, an amount of increase ΔRb of the capacity maintenance ratio by the replacement of battery pack 10 is larger than ΔRc. Therefore, a capacity maintenance ratio higher than threshold value Rth can be secured even upon the planned time of changing over to a different vehicle (Dchg<Db, where Db represents a traveling distance at the point of time at which the capacity maintenance ratio reaches threshold value Rth). Hence, the B rank battery pack can be selected.

Although not illustrated, it can be also considered to replace presently used battery pack 10 with an A rank battery pack. When replaced with an A rank battery pack, the amount of increase of the capacity maintenance ratio becomes much larger than that when replaced with a B rank battery pack. Accordingly, the capacity maintenance ratio at the planned time of changing over to a different vehicle can be more securely higher than threshold value Rth. However, in consideration of the past history of use of vehicle 1, the increase of the capacity maintenance ratio in the case of replacement with an A rank battery pack is excessive, thus resulting in an unnecessary expense (replacement expense) corresponding to a price difference between the A rank battery pack and the B rank battery pack.

On the other hand, as compared with the case of replacing with a B rank battery pack, the saved expense may be increased by the possible EV traveling distance extended due to the replacement with an A rank battery pack. Hence, the replacement expense and saved expense in the case of selecting an A rank battery pack is compared with the replacement expense and saved expense in the case of selecting a B rank battery pack, and then it is determined to select a desirable one from the A rank battery pack and the B rank battery pack. In the example shown in FIG. 9, it is desirable for the user of vehicle 1 to select the B rank battery pack, rather than the A rank battery pack. Therefore, server 3 proposes the replacement with the B rank battery pack to the user.

It should be noted that when information about the lowest rank of battery pack having a life longer than a period until the planned time of changing over to a different vehicle is not registered in recycled battery pack database 320, server 3 preferably selects a battery pack having the second lowest rank. In this example, an A rank battery pack can be proposed to the user when no B rank battery pack is registered in recycled battery pack database 320.

FIG. 10 shows exemplary information presented on display 42 of terminal 4. FIG. 10A shows exemplary information presented when battery pack 10 is not required to be replaced (see S140 of FIG. 3). As shown in FIG. 10A, display 42 presents: a traveling distance, predicted from the past traveling history of vehicle 1, until the time of changing over to a different vehicle; and a distance in which vehicle 1 can travel from the present time if battery pack 10 is not replaced. In addition, display 42 presents that it is not necessary to replace battery pack 10.

On the other hand, FIG. 10B shows exemplary information presented when it is desirable to replace battery pack 10 (see S150 of FIG. 3). As with FIG. 10A, display 42 presents: a traveling distance, predicted from the past traveling history of vehicle 1, until the time of changing over to a different vehicle; and a distance in which vehicle 1 can travel from the present time if battery pack 10 is not replaced. Moreover, display 42 presents the replacement expense and saved expense when replaced with a new battery pack, and presents a difference between the replacement expense and the saved expense as a substantial actual expense. Also in the case of replacement with a recycled battery pack (replacement with an A rank battery pack or a B rank battery pack in the example of FIG. 9), display 42 presents a replacement expense, a saved expense, and a substantial actual expense. Further, it is also presented that the B rank battery pack is more desirable than the A rank battery pack. By comparing and reviewing these pieces of information, the user can determine a desirable battery pack for the replacement.

It should be noted that in the example shown in FIG. 10B, the user is notified that the B rank battery pack is desirable (recommended rank); however, this may not be notified. The user may be simply notified of: information about various expenses for a new battery pack; and information about various expenses for all the ranks of recycled battery packs replaceable with battery pack 10.

As described above, according to the first embodiment, in the replacement with a recycled battery pack, a recycled battery pack having a life longer than the period until the planned time of changing over from vehicle 1 to a different vehicle is selected from the A to D rank battery packs. Further, the user is notified of the various types of expense information in selecting that battery pack (the replacement expense, saved expense, and substantial actual expense). By selecting a rank of recycled battery pack having a life longer than the period until the planned time of changing over to a different vehicle, vehicle 1 can be continued to be used until the planned time of changing over to a different vehicle after the replacement of battery pack 10. Moreover, by proposing a battery pack having an appropriate life in accordance with the past traveling history of vehicle 1, the replacement expense of battery pack 10 can be reduced, thus suppressing the actual expense paid by the user. Thus, based on the past history of use of vehicle 1 and the life of each rank of recycled battery pack, the replacement candidate is determined and the various types of expense information are provided, whereby the user can appropriately determine a desirable battery pack for the replacement.

In the present embodiment, it has been illustrated that vehicle 1 is a plug-in hybrid vehicle; however, terminal 4 can perform the same processes also when vehicle 1 is an ordinary hybrid vehicle (that cannot be externally charged) or is a fuel cell vehicle. On the other hand, when vehicle 1 is an electric vehicle, terminal 4 can perform basically the same processes as the above-described processes except that the process (see S252 in FIG. 7 or S263 in FIG. 8) of calculating the saved expense is omitted.

[Modification 1 of First Embodiment]

In the first embodiment, it has been illustrated that both a new battery pack and a recycled battery pack are proposed to the user as replacement candidates for battery pack 10. However, the user may be permitted to select in advance whether the user desires a new battery pack or a recycled battery pack.

Figure 11:
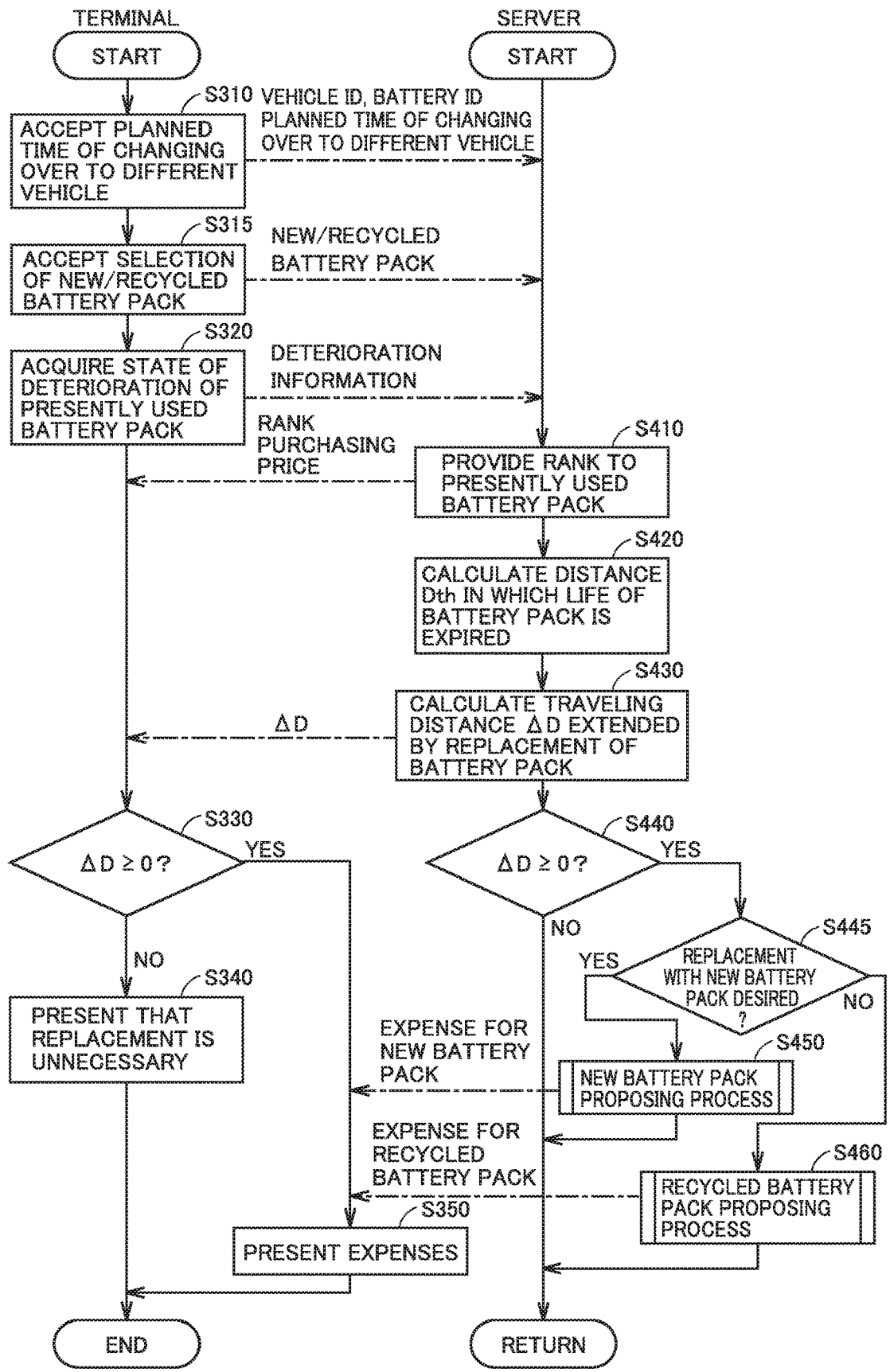
FIG. 11 is a flowchart for illustrating a battery information providing process in a modification 1 of the first embodiment.

FIG. 11 is a flowchart for illustrating a battery information providing process in a modification 1 of the first embodiment. This flowchart is different from the flowchart (see FIG. 3) in the first embodiment in that processes of S315 and S445 are further included therein. The processes of S310, S320 to S350, S410 to S440, S450, and S460 are equivalent to the processes of S210 to S240, S250, and S260 in the first embodiment, and therefore will not be described repeatedly.

In S310, in terminal 4, the user acquires the information about the planned time of changing over from vehicle 1 to a different vehicle and transmits it to server 3. Further, terminal 4 accepts a user operation as to which one of a new battery pack and a recycled battery pack the user desires as a replacement candidate for battery pack 10 (S315). Information indicating which one of a new battery pack and a recycled battery pack the user desires is also transmitted to server 3.

Then, when difference ΔD in traveling distance has a positive value or a value of 0 in S440 (YES in S440), server 3 advances the process to S445 to determine whether or not the user desires a new battery pack in S315. When the user desires a new battery pack (YES in S445), server 3 performs the new battery pack proposing process (see FIG. 7) (S450). On the other hand, when the user desires a recycled battery pack (NO in S445), server 3 performs the recycled battery pack proposing process (see FIG. 8) (S460).

As described above, according to modification 1 of the first embodiment, in accordance with the result of the user's selection of a new/recycled battery pack, it is determined whether server 3 performs the new battery pack proposing process or the recycled battery pack proposing process. Accordingly, an arithmetic load on server 3 can be reduced as compared with a case where both the processes are performed.

[Modification 2 of First Embodiment]

In the first embodiment, it has been illustrated that the rank (state of deterioration) of battery pack 10 is determined based on the following three items: the traveling time of vehicle 1; the traveling distance of vehicle 1; and the capacity maintenance ratio of battery pack 10. However, the method of determining the rank of battery pack 10 is not limited to this. In a modification 2 of the first embodiment, the following method will be described: the state of deterioration of the battery pack is determined using an AC impedance measurement method and the rank of the battery pack is determined based on the result of determination.

Figure 12:
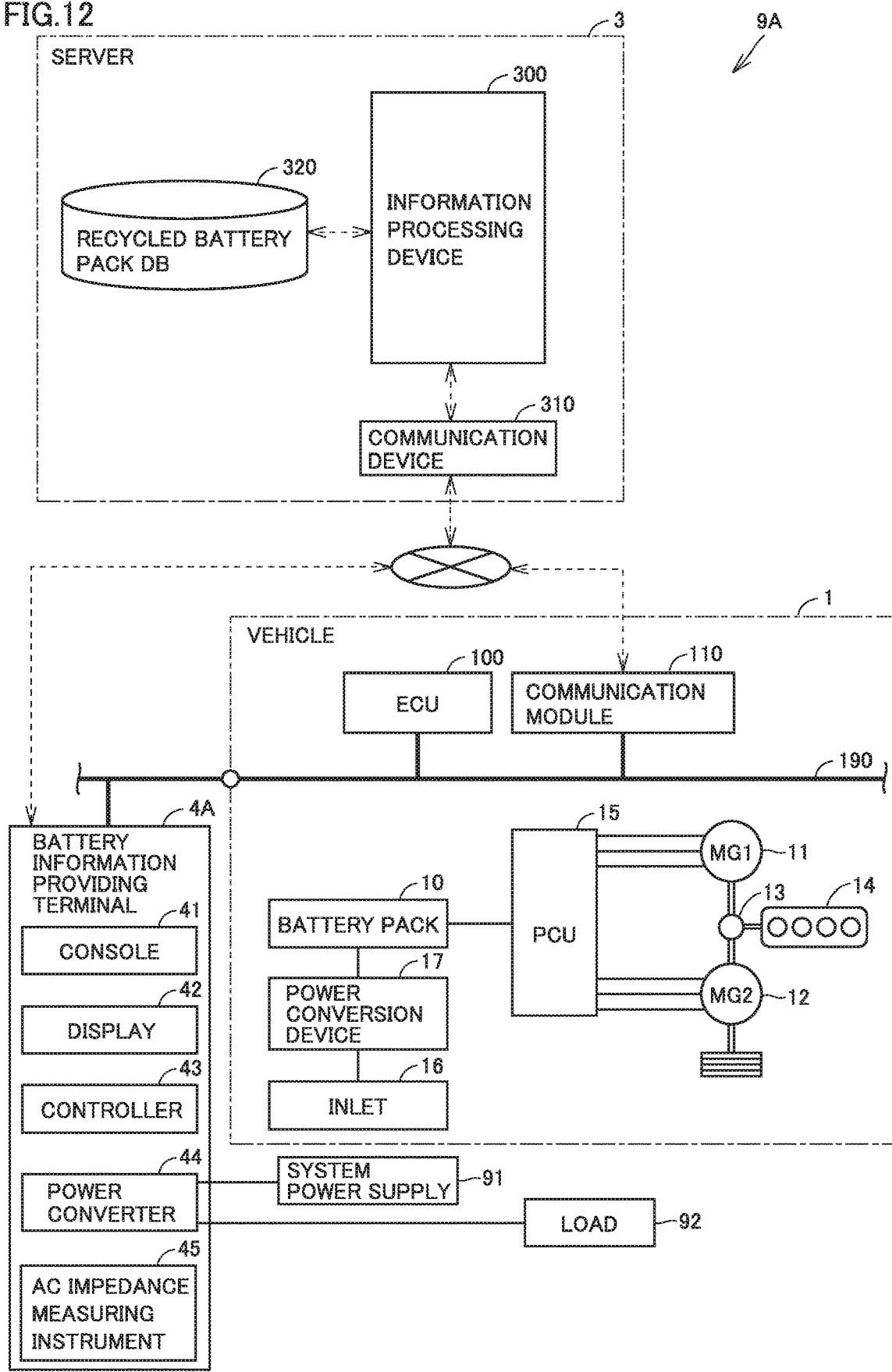
FIG. 12 schematically shows a configuration of a battery replacement assisting system according to a modification 2 of the first embodiment.

FIG. 12 schematically shows a configuration of a battery replacement assisting system according to modification 2 of the first embodiment. Battery replacement assisting system 9A is different from battery replacement assisting system 9 according to the first embodiment in that battery replacement assisting system 9A includes a terminal 4A instead of terminal 4. Terminal 4A further includes a power converter 44 and an AC impedance measuring instrument 45 in addition to console 41, display 42, and controller 43. Power converter 44 is electrically connected to a system power supply 91 and a load 92.

Figure 13:
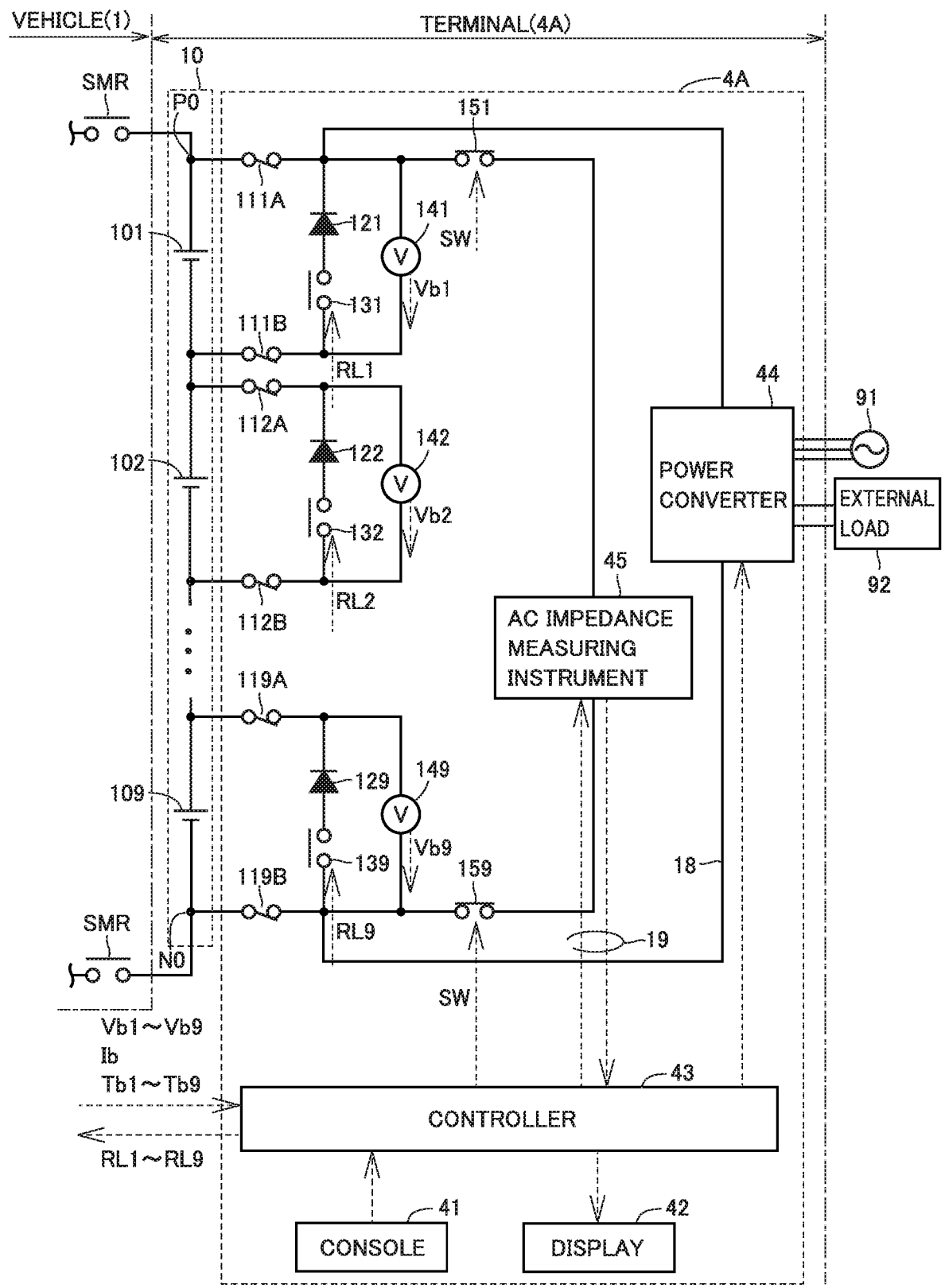
FIG. 13 shows a configuration of a terminal in modification 2 of the first embodiment more in detail.

FIG. 13 shows the configuration of terminal 4A in modification 2 of the first embodiment more in detail. A positive electrode node P0 of battery pack 10 is electrically connected to one of two relays included in a system main relay SMR of a vehicle. A negative electrode node NO of battery pack 10 is electrically connected to the other of the two relays. While terminal 4A is connected to battery pack 10, system main relay SMR is always maintained to be in an open state.

Battery pack 10 includes a plurality of cells 101 to 109 connected in series. In modification 2 of the first embodiment, each cell is a lithium ion secondary battery. In the description herein, it will be illustrated that nine cells are used; however, the number of the cells is not particularly limited as long as a plurality of cells are used. It should be noted that battery pack 10 is provided with an equalization circuit (not shown) for equalizing voltage of each cell.

Terminal 4A further includes: a plurality of clamps 111A, 111B to 119A, 119B; a plurality of diodes 121 to 129, a plurality of relays 131 to 139; a plurality of voltage sensors 141 to 149, and switches 151, 159. Since respective circuit configurations provided to correspond to cells 101 to 109 are the same, the following representatively describes the circuit configuration corresponding to cell 101.

Clamp 112A is electrically connected to the positive electrode terminal side of cell 101. Clamp 111B is electrically connected to the negative electrode terminal side of cell 101. Diode 121 and relay 131 are connected in series between clamp 111A and clamp 111B. The cathode of diode 121 is electrically connected to clamp 111A. The anode of diode 121 is electrically connected to one end of relay 131. The other end of relay 131 is electrically connected to clamp 111B. Relay 131 is opened or closed in response to a control signal RL1 from controller 43. Relay 131 is opened when cell 101 is permitted to be discharged and is closed when cell 101 is prohibited to be discharged.

Voltage sensor 141 detects voltage Vb1 of cell 101, and sends a detection result thereof to controller 43. In the description below, voltage Vb1 of cell 101 to voltage Vb9 of cell 109 are also referred to as "voltage Vb" when they are not particularly distinguished from one another. Although not shown, battery pack 10 is further provided with a current sensor and a temperature sensor. From the current sensor, controller 43 acquires electric current Ib flowing in battery pack 10. From the temperature sensor, controller 43 acquires temperatures Tb1 to Tb9 of the cells.

Switch 151 is electrically connected between clamp 111A and AC impedance measuring instrument 45. Switch 159 is electrically connected between clamp 119B and AC impedance measuring instrument 45. Each of switches 151, 159 is opened or closed in response to a control signal SW from controller 43. Each of switches 151, 159 is closed when measuring the AC impedance of battery pack 10, whereas each of switches 151, 159 is opened when charging and discharging battery pack 10.

Power converter 44 is electrically connected between clamp 11 IA and clamp 119B. Power converter 44 charges/discharges battery pack 10 in response to a control command from controller 43. For example, power converter 44, which includes an inverter (not shown), converts AC power supplied from system power supply 91 into DC power, thereby charging battery pack 10. Moreover, power converter 44, which further includes a converter (not shown), converts the voltage of power stored in battery pack 10 and supplies it to load 92, thereby discharging battery pack 10.

AC impedance measuring instrument 45 is configured to measure the AC impedance of battery pack 10 as described below.

Figure 14:
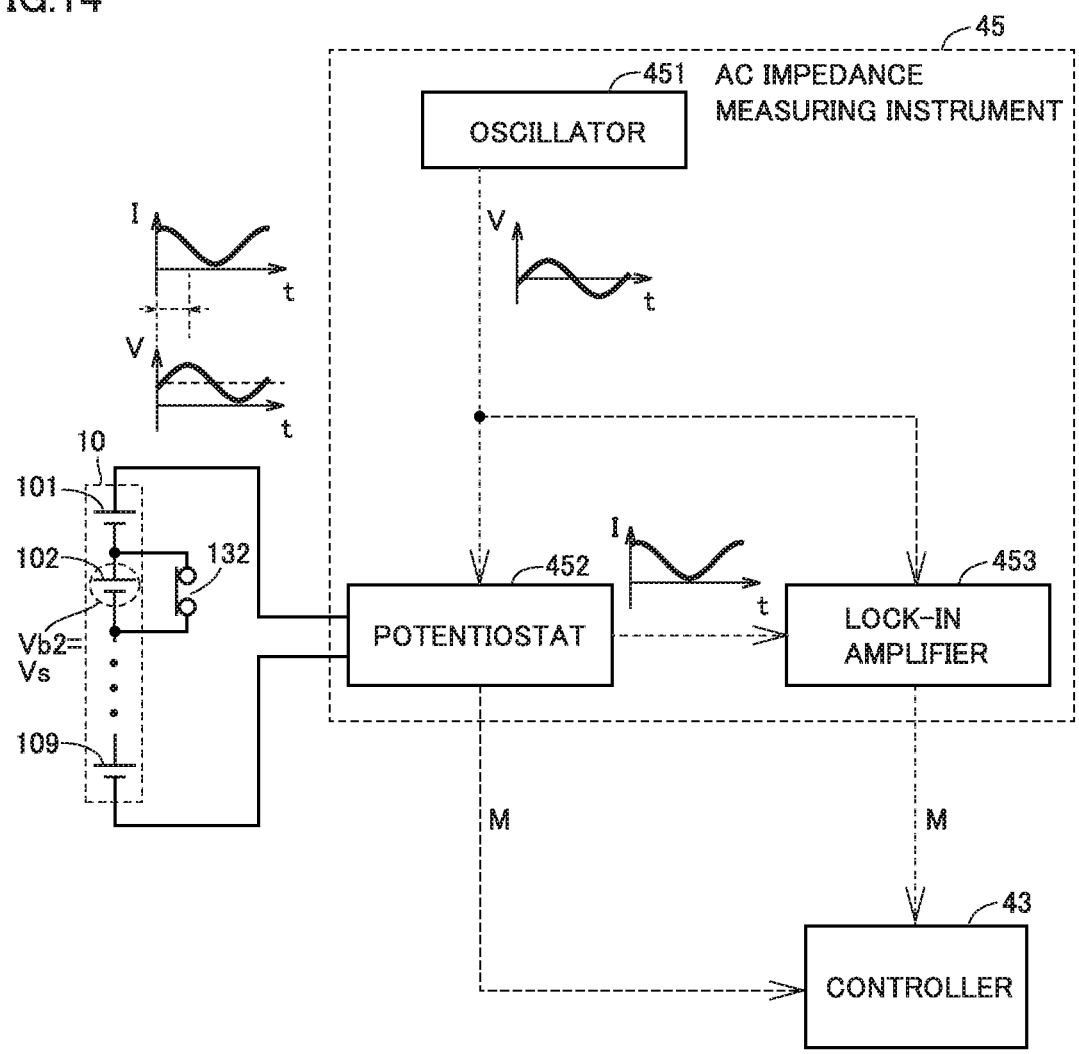
FIG. 14 shows a configuration of an AC impedance measuring instrument more in detail.

FIG. 14 shows the configuration of AC impedance measuring instrument 45 more in detail. AC impedance measuring instrument 45 includes an oscillator 451, a potentiostat 452, and a lock-in amplifier 453.

Oscillator 451 outputs a sinusoidal wave having the same phase to potentiostat 452 and lock-in amplifier 453. Potentiostat 452 superimposes, on a predetermined DC voltage, an AC voltage having the same phase as that of the sinusoidal wave from oscillator 451 (for example, a voltage having an amplitude of about 10 mV), and applies it onto battery pack 10. Moreover, potentiostat 452 detects an AC component of current flowing in battery pack 10, and outputs the detection result to lock-in amplifier 453. Moreover, potentiostat 452 outputs the AC voltage and the AC component of the current to controller 43 as a measurement result M. Lock-in amplifier 453 compares the phase of the sinusoidal wave received from oscillator 451 with the phase of the AC component of the current detected by potentiostat 452, and outputs a phase difference between the sinusoidal wave and the AC component to controller 43 as a measurement result M.

The impedance of battery pack 10 includes various impedance components having different relaxation times (times required to change the system to cause current to flow), such as: a component due to solution resistance; a component due to charge transfer resistance at an electrode/electrolyte interface (resistance upon insertion/desertion of lithium ions into/from an active material); and a component due to the capacitance of an electrical double layer formed on an electrode surface. For example, when an AC voltage having a high frequency is applied to battery pack 10, a component having a small relaxation time can follow a change of the AC voltage. On the other hand, a component having a large relaxation time cannot follow the change of the AC voltage because a voltage having an opposite polarity is applied before the current flows. Therefore, while gradually changing (i.e., sweeping) a frequency f (angular frequency ω) of the sinusoidal wave output from oscillator 451, the AC voltage applied to battery pack 10 and the AC flowing in battery pack 10 are measured, whereby a dominant impedance component of battery pack 10 at angular frequency ω can be identified.

For each swept angular frequency ω, controller 43 calculates impedance (an amplitude ratio of the AC voltage and the current). Then, controller 43 plots, on a complex plane (see FIG. 16 below), the result of calculation of the impedance and the phase difference detected by lock-in amplifier 453.

Figure 15:
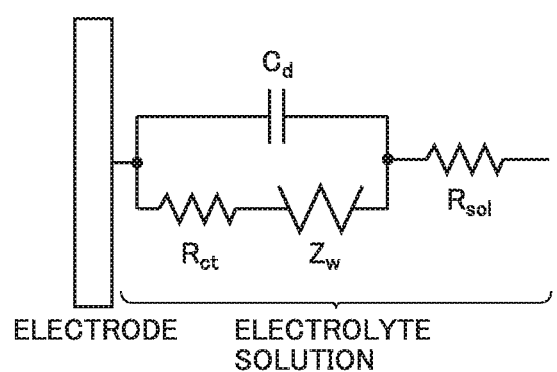
FIG. 15 shows an exemplary equivalent circuit at an electrode interface of a lithium ion secondary battery.

FIG. 15 shows an exemplary equivalent circuit at an electrode interface of the lithium ion secondary battery. In the description below, $R_{sol}$ represents the solution resistance of the electrolyte solution, $R_{ct}$ represents the charge transfer resistance, and $C_d$ represents the capacitance of the electrical double layer of the electrode surface. Moreover, $Z_w$ represents an impedance component (also referred to as "Warburg impedance") associated with a diffusion rate of the electrode reaction.

Figure 16:
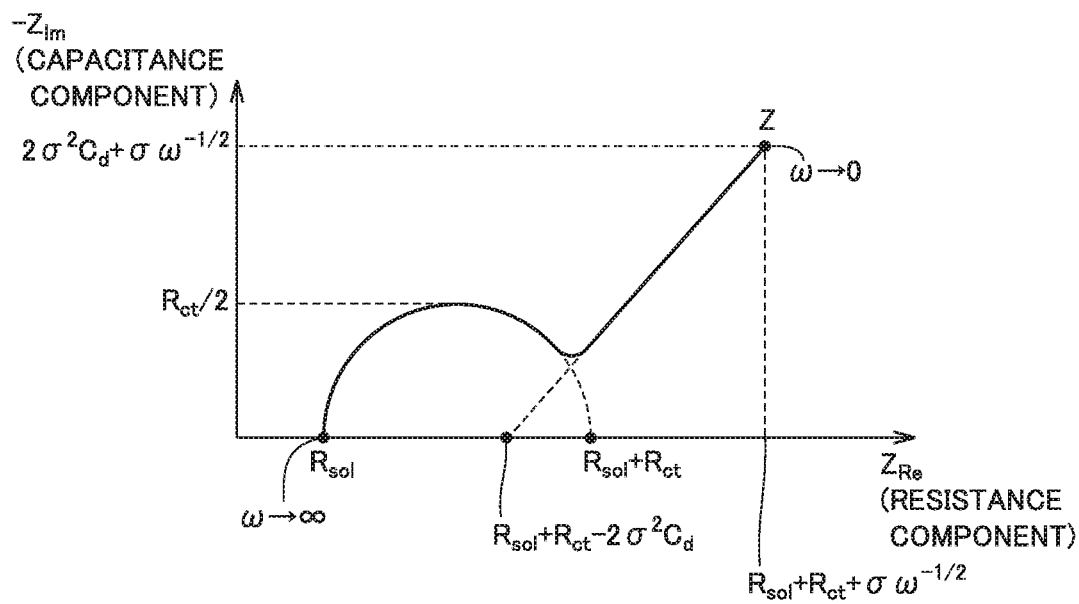
FIG. 16 is a complex impedance plot (Nyquist plot) of measurement results of AC impedances.

FIG. 16 is a complex impedance plot (Nyquist plot) of the measurement results of the AC impedances. In FIG. 16 and FIG. 18, the horizontal axis represents a real number component $Z_{Re}$ (resistance component) of the complex impedance, and the vertical axis represents an imaginary number component $-Z_{Im}$ (capacitance component) of the complex impedance. Angular frequency ω is swept in a range of 10 mHz to 100 kHz, for example.

In a high frequency region of angular frequency ω, a semicircular locus appears. This locus is expressed as in the following formula (1). In other words, solution resistance $R_{sol}$ and charge transfer resistance $R_{ct}$ can be determined from this locus.

$$\left(Z_{Re} - R_{sol} - \frac{R_{ct}}{2}\right)^2 + Z_{Im}^2 = \left(\frac{R_{ct}}{2}\right)^2 \quad (1)$$

On the other hand, since the diffusion rate in the electrode reaction of the lithium ion secondary battery is relatively slow, a linear locus appears in a low frequency region of angular frequency ω. This linear locus is expressed as in the following formula (2). It should be noted that in the formula (2), the following formula (3) is established between σ (constant determined according to the current and the temperature) and Warburg impedance $Z_w$.

$$-Z_{Im} = Z_{Re} - R_{sol} - R_{ct} + 2\sigma^2 C_d \quad (2)$$

$$Z_W = \sigma\omega^{-1/2}(1-j) \quad (3)$$

According to the formulas (2) and (3), it is understood that in a measurement point Z at a sufficiently low angular frequency ω (point at a measurement frequency lower than a predetermined frequency), real number component $Z_{Re}$ of the complex impedance can be approximated to $(R_{sol}+R_{ct}+\sigma\omega^{-1/2})$ and imaginary number component $-Z_{Im}$ can be approximated to $(2\sigma^2 C_d + \sigma\omega^{-1/2})$.

Generally, it has been known that in the lithium ion secondary battery, so-called "high-rate deterioration" is caused by repeated charging or discharging with large current. The high-rate deterioration is caused due to imbalance in distribution of lithium ions in the electrolyte solution and is associated with diffusion of ions. Hence, the high-rate deterioration is likely to be reflected in a measurement point at a sufficiently low angular frequency ω (for example, measurement point Z in FIG. 16). Therefore, in the first embodiment, the state of deterioration of battery pack 10 is determined with attention paid to measurement point Z.

Figure 17:
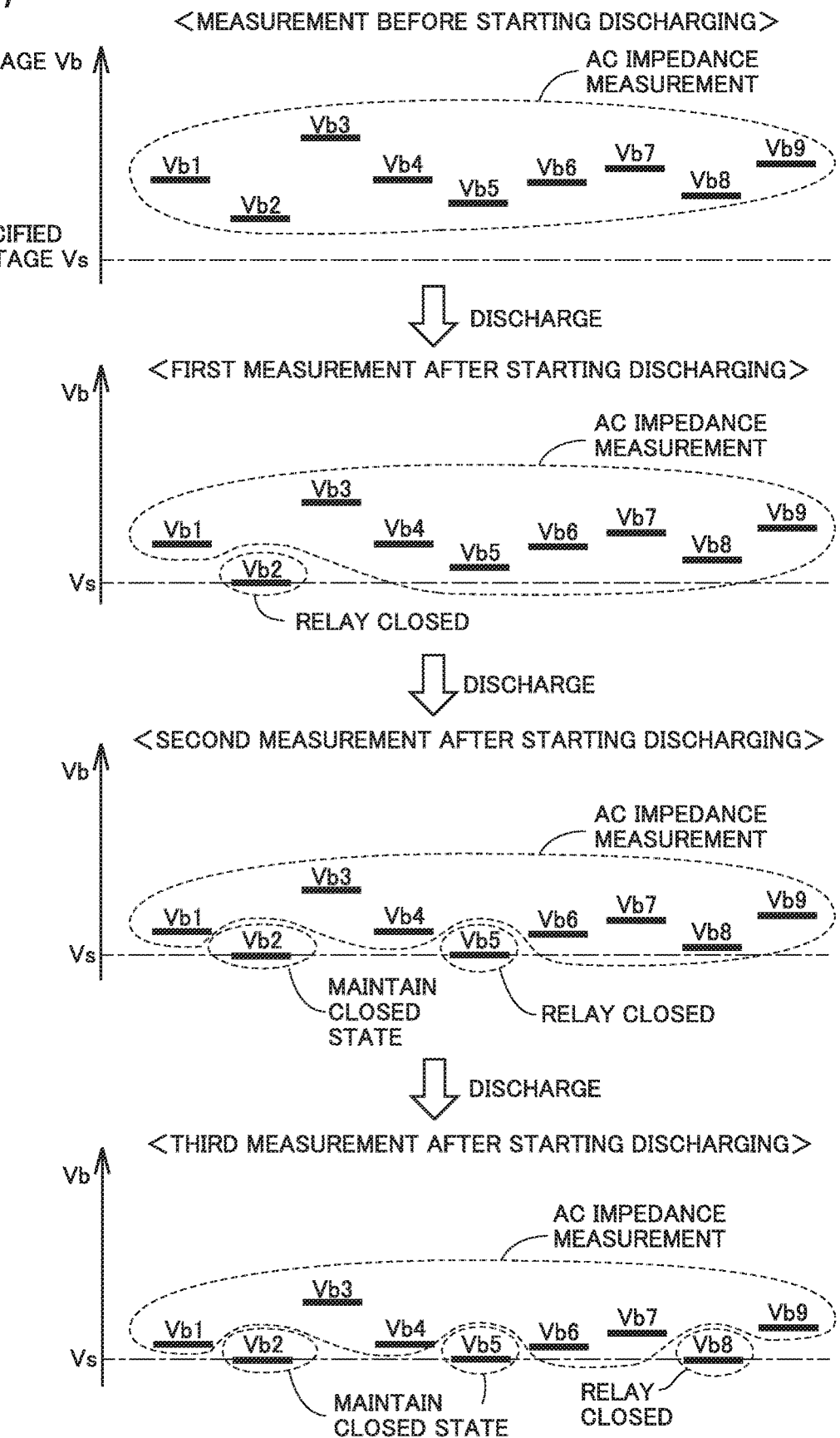
FIG. 17 schematically illustrates a method of determining a state of deterioration of the battery pack.

FIG. 17 schematically illustrates a method of determining the state of deterioration of battery pack 10. In FIG. 17, the vertical axis represents voltage Vb of each cell (one of voltage Vb1 of cell 101 to voltage Vb9 of cell 109) before starting discharging of battery pack 10 or after starting discharging of battery pack 10. Although battery pack 10 is provided with the equalization circuit (not shown), there can be a slight variation among voltages Vb1 to Vb9 (for example, a variation of about several mV to several ten mV). The following describes a case where before the start of discharging, each of voltages Vb1 to Vb9 is higher than predetermined specified voltage Vs and voltages Vb2, Vb5, Vb8 are smaller (i.e., closer to specified voltage Vs) in this order.

With reference to FIG. 13 and FIG. 17, before starting the discharging, relays 131 to 139 are all open and all the cells 101 to 109 are connected in series. In this state, the AC impedance is measured and a measurement result M(0) is stored in a memory (not shown) of controller 43.

Next, battery pack 10 starts to be discharged. Voltages Vb1 to Vb9 of the cells are decreased with passage of time. Voltage Vb2 of cell 102 first reaches specified voltage Vs. Accordingly, battery pack 10 is stopped being discharged and relay 132 connected to cell 102 in parallel is closed. Accordingly, cell 102 is bypassed, with the result that cells (cells 101, 103 to 109) other than cell 102 are connected in series. In this state, AC impedance measurement (first measurement after discharging) is performed, and a measurement result M(1) is stored in the memory.

Then, the discharging of battery pack 10 is resumed with relay 132 being maintained in the closed state. After voltage Vb2 of cell 102, voltage Vb5 of cell 105 reaches specified voltage Vs. Accordingly, battery pack 10 is stopped being discharged and relay 135 connected to cell 105 in parallel is closed. Accordingly, cells 102, 105 are bypassed, with the result that cells (cells 101, 103, 104, 106 to 109) other than cells 102, 105 are connected in series. In this state, AC impedance measurement is performed, and a measurement result M(2) is stored in the memory.

Further, the discharging of battery pack 10 is resumed with relays 132, 135 being maintained in the closed state. When voltage Vb8 of cell 108 reaches specified voltage Vs, the discharging of battery pack 10 is stopped and relay 138 connected to cell 108 in parallel is closed as with the above-described process. Then, AC impedance measurement is performed with cells (cells 101, 103, 104, 106, 107, 109) other than cells 102, 105, 108 being connected in series, and a measurement result M(3) is stored in the memory.

The same process is repeated until each of voltages Vb1 to Vb9 of all the cells 101 to 109 reaches specified voltage Vs. In other words, AC impedance is measured in a state in which all the cells other than the cell(s) having voltage(s) having reached specified voltage Vs are connected in series. Further, as described below, the results of two continuous AC impedance measurements are compared to diagnose whether or not each cell is abnormal.

FIG. 18 shows a complex impedance plot for illustrating exemplary measurement results of AC impedances. A curve L0 represents measurement result M(0) before starting the discharging of battery pack 10 (i.e., measurement result when all the cells 101 to 109 are connected in series). A curve L1 represents measurement result M(1) when the cells other than cell 102 are connected in series. A curve L2 represents measurement result M(2) when the cells other than cells 102, 105 are connected in series. A curve L3 represents measurement result M(3) when the cells other than cells 102, 105, 108 are connected in series.

First, the following describes the method of determining the state of deterioration of cell 102. In the diagnosis for cell 102, the measurement result (curve L0) of the AC impedance when cell 102 is included is compared with the measurement result (curve L1) of the AC impedance when cell 102 is not included (cell 102 is excluded). When cell 102 is not deteriorated much, the impedance of cell 102 is sufficiently low. Therefore, the measurement result (curve L0) when cell 102 is included becomes substantially equal to the measurement result (curve L1) when cell 102 is not included. On the other hand, when cell 102 is deteriorated more, the impedance of cell 102 becomes higher than the impedance of another cell (cell less deteriorated). Therefore, a certain degree of difference appears between the measurement result (curve L0) when cell 102 is included and the measurement result (curve L1) when cell 102 is not included.

More specifically, in the first embodiment, a measurement result at measurement frequency $\omega$ lower than a predetermined frequency (measurement point Z0) is used. Moreover, in order to compare measurement point Z0 (R0, X0) on curve L0 with a measurement point Z1 (R1, X1) on curve L1, a difference $\Delta R1$ (=R0−R1) between the resistance components of the impedances and a difference $\Delta X1$ (=X0−X1) between the capacitance components of the impedances are calculated.

It is determined that the deterioration of cell 102 has advanced when at least one of a first condition and a second condition is satisfied. The first condition is such that difference $\Delta R1$ between the resistance components is larger than a predetermined reference value Rc. The second condition is such that difference $\Delta X1$ between the capacitance components is larger than a predetermined reference value Xc. On the other hand, when neither of first and second conditions are satisfied, it is diagnosed that the deterioration of cell 102 has not advanced. In the example shown in FIG. 18, since difference $\Delta R1$ is larger than reference value Rc and difference $\Delta X1$ is larger than reference value Xc, it is determined that cell 102 is deteriorated. The same applies to other cells (cells 105, 108 in FIG. 18) and therefore detailed description will not be repeated.

Thus, controller 43 determines the states of deterioration of all the cells, and then calculates the ratio (the ratio of deteriorated cells) of the number of cells determined to have advanced deterioration to the number of all the cells. Generally, this ratio is about 0 in a new battery pack, and is increased as the deterioration of the battery pack is advanced. Therefore, controller 43 determines to provide battery pack 10 with a higher rank as the ratio of the deteriorated cells is lower.

As described above, according to modification 2 of the first embodiment, the state of deterioration of each cell included in battery pack 10 is determined using the AC impedance measurement method, and battery pack 10 is ranked based on the result of determination. For each of the plurality of cells included in the battery pack, the characteristics (resistance component and capacitance component) thereof are calculated using the AC impedance measurement method, thereby determining the state of deterioration of battery pack 10 more accurately.

Second Embodiment

In a second embodiment, the following describes a method of diagnosing whether or not there is an abnormality in battery pack 10, using a possible EV traveling distance of a vehicle. It should be noted that in the present disclosure, the term "possible EV traveling distance" means a distance in which a vehicle can travel until power stored in a battery pack is consumed to a defined value. The possible EV traveling distance includes a maximum distance in which the vehicle can travel when the amount of power is maximum (SOC (State Of Charge)=100%), but is not limited to this. The possible EV traveling distance can include a distance in which the vehicle can travel until an amount of power at a certain point of time is consumed to the defined value.

Figure 19:
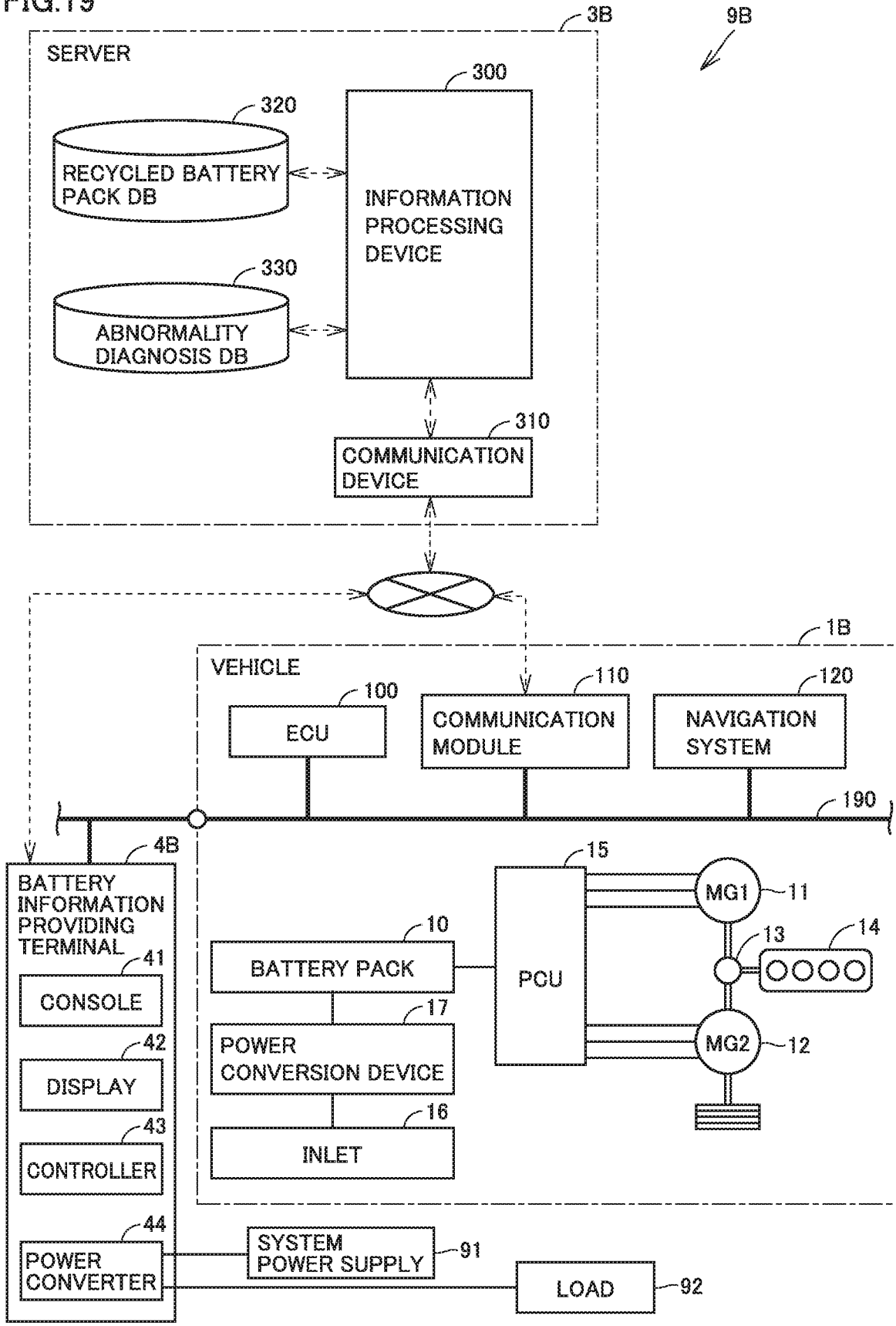
FIG. 19 schematically shows a configuration of a battery replacement assisting system according to a second embodiment.

FIG. 19 is schematically shows a configuration of a battery replacement assisting system according to the second embodiment. Battery replacement assisting system 9B is different from battery replacement assisting system 9A (see FIG. 12) according to modification 2 of the first embodiment in the following points: battery replacement assisting system 9B includes a terminal 4B instead of terminal 4A; and battery replacement assisting system 9B includes a server 3B instead of server 3.

As with terminal 4A, terminal 4B is provided with power converter 44 configured to be connectable to system power supply 91 and load 92. Server 3B further includes an abnormality diagnosis database 330 in addition to recycled battery pack database 320. Abnormality diagnosis database 330 stores various types of information used for the abnormality diagnosis of battery pack 10.

Moreover, vehicle 1B is a hybrid vehicle or a plug-in hybrid vehicle (FIG. 19 shows an example in which vehicle 1B is a plug-in hybrid vehicle). Vehicle 1B further includes a navigation system 120. Navigation system 120 includes a storage, a GPS (Global Positioning System) receiver, a traveling state detector, and a computer (each not shown).

The storage stores: road map data; and facility data accompanied therewith, such as various shops, for example. The GPS receiver specifies the present location of vehicle 1 based on electric waves from satellites. The traveling state detector includes a gyroscope and a geomagnetic field sensor to detect the traveling state of vehicle 1, for example. The computer calculates the present location, traveling direction, speed, and the like of vehicle 1 based on a signal from each sensor included in the GPS receiver and the traveling state detector. The configurations of battery replacement assisting system 9B other than those described above are basically the same as the configurations of battery replacement assisting system 9A.

In battery replacement assisting system 9B configured as described above, terminal 4B is configured to perform the "abnormality diagnosis process" for battery pack 10 in addition to the battery information providing process (see FIG. 3) described in the first embodiment. In the abnormality diagnosis process for battery pack 10, a travel route used for calculation of the possible EV traveling distance of vehicle 1 is registered in navigation system 120 in advance. This travel route is desirably a route on which the user travels usually (for example, a commuting route from the user's house to a workplace) and longer than the possible EV traveling distance of vehicle 1 (for example, about several ten km).

Figure 20:
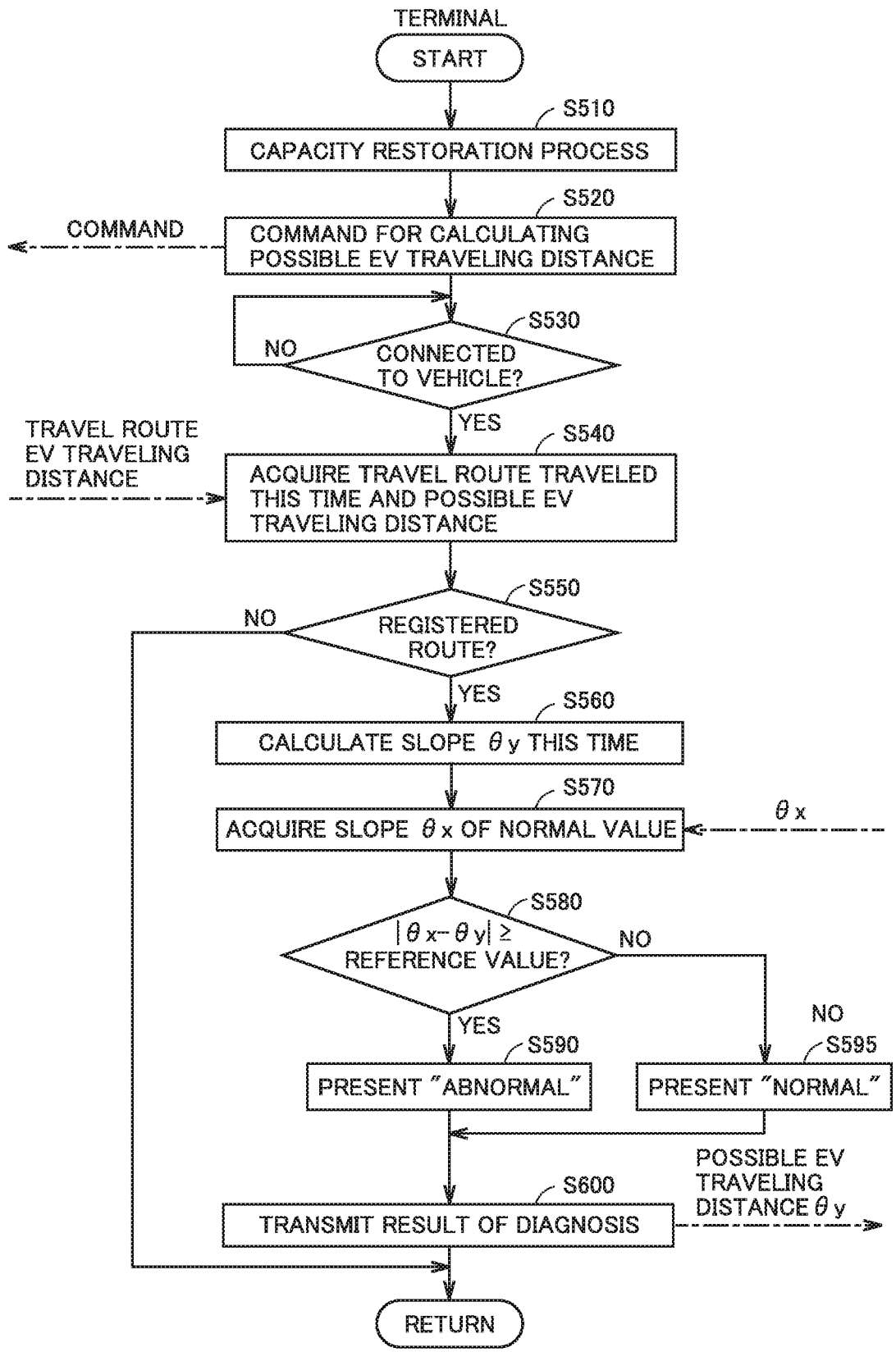
FIG. 20 is a flowchart for illustrating an abnormality diagnosis process for a battery pack in the second embodiment.

FIG. 20 is a flowchart for illustrating the abnormality diagnosis process for battery pack 10 in the second embodiment. The process of this flowchart is invoked from a main routine (not shown) and is executed per predetermined cycle (for example, once half a year or once a year).

In S510, terminal 4B performs a capacity restoration process for restoring the capacity of battery pack 10. Although details of this process will be described later, by restoring the capacity of battery pack 10, conditions (measurement condition for the possible EV traveling distance) for calculating possible EV traveling distances for the purpose of subsequent comparison and review can be set to be the same (see S580).

Figure 21:
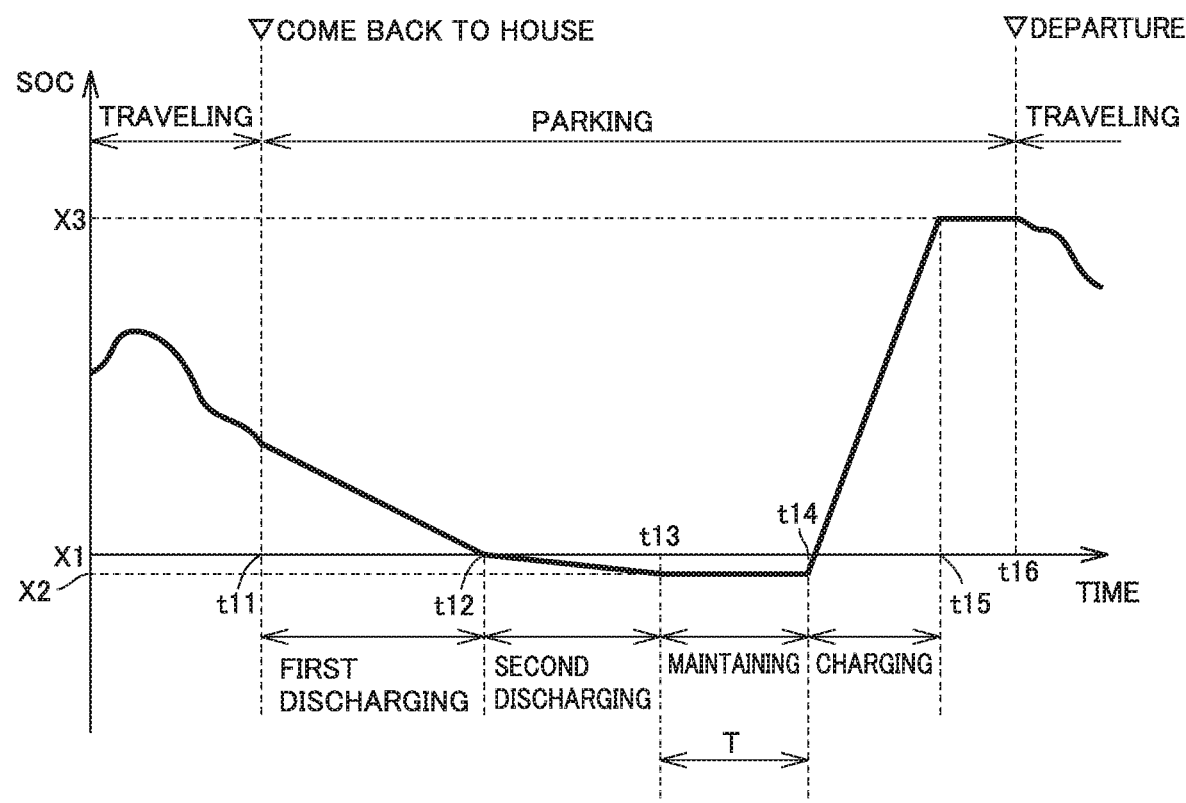
FIG. 21 is a time chart for illustrating a capacity restoration process (process of S510) for the battery pack.

FIG. 21 is a time chart for illustrating the capacity restoration process (process of S510) for battery pack 10. In FIG. 21, the horizontal axis represents passage of time, whereas the vertical axis represents the SOC of battery pack 10.

When the user comes back to the house from the workplace and connects terminal 4B to vehicle 1B at a time t11 (for example, a time in evening), terminal 4B performs the capacity restoration process for battery pack 10. At this point of time, power excessive for the capacity restoration process is stored in battery pack 10. Therefore, a first discharging process is first performed to discharge power stored in battery pack 10 to an external load (not shown) via inlet 16 and the power cable.

When the SOC of battery pack 10 reaches a defined value X1 at a time t12, the first discharging process is stopped. Next, a second discharging process is performed to discharge power stored in battery pack 10 to the load via terminal 4B. Accordingly, the SOC of battery pack 10 is further decreased to a reference value X2.

When the SOC of battery pack 10 reaches reference value X2 at a time t13, the second discharging process is stopped. Then, the voltage of battery pack 10 is adjusted to maintain the SOC of battery pack 10 to be equal to or less than reference value X2 (maintaining process). A period T for the maintaining process is a period required for restoration of the capacity of battery pack 10, and is preferably several hours, for example.

With passage of period T at a time t14, it is assumed that the restoration of the capacity of battery pack 10 is completed and battery pack 10 starts to be charged for return of vehicle 1 to the user. This charging is performed until the SOC of battery pack 10 reaches a defined value X3 (for example, a time t15 in the next morning). Defined value X3 is preferably set at a value (for example, SOC=90%) close to the full charge state of battery pack 10. The user heads for, for example, the workplace by driving vehicle 1 including battery pack 10 having the capacity restored (time t16).

It should be noted that the rated power of power converter 44 included in terminal 4B is smaller than the rated power of power conversion device 17. Therefore, the rate of discharging in the second discharging process is lower than the rate of discharging in the first discharging process. Hence, the first discharging process is not a process essential for the capacity restoration of battery pack 10, although in the example shown in FIG. 20, the first discharging process is performed in order to reduce time taken for the SOC of battery pack 10 to be decreased to defined value X1.

Thus, the capacity of battery pack 10 can be restored by maintaining battery pack 10 in the low SOC state (the state in which the SOC is not more than rated value X1) in the second discharging process and the maintaining process. Particularly, the capacity restoration amount of battery pack 10 can be increased by decreasing the SOC of battery pack 10 to reference value X2 and maintaining this state for period T.

Turning back to FIG. 20, in S520, terminal 4B outputs a command to vehicle 1 to calculate the possible EV traveling distance of vehicle 1. Then, the user removes terminal 4B from vehicle 1, and starts traveling vehicle 1 toward the destination (workplace). During the traveling, vehicle 1 calculates the possible EV traveling distance in accordance with the command from terminal 4B.

Terminal 4B stands by (NO in S530) until the user who went to the workplace comes back to the house again and connects terminal 4B to vehicle 1. When terminal 4B is connected to vehicle 1, terminal 4B advances the process to S540.

In S540, from vehicle 1, terminal 4B acquires the travel route traveled this time and the possible EV traveling distance.

Figure 22:
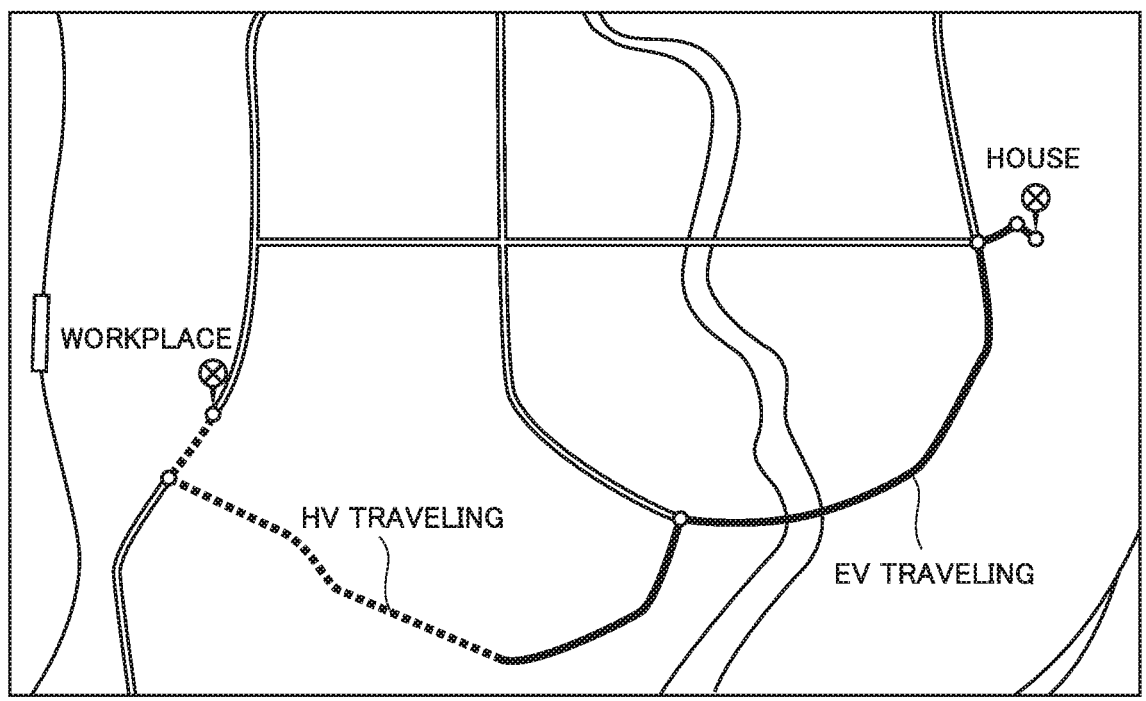
FIG. 22 illustrates a possible EV traveling distance acquired from vehicle 1.

FIG. 22 illustrates the possible EV traveling distance acquired from vehicle 1. As shown in FIG. 22, a travel route (hereinafter, this route will be also referred to as "registered route") from the user's house to the workplace is registered in navigation system 120, for example. When vehicle 1 travels along the registered route and the SOC of battery pack 10 is higher than the defined value, the EV travel is basically performed in a CD (Charge Depleting) mode (as indicated by a solid line). On the other hand, when the SOC of battery pack 10 reaches the defined value, the traveling mode is changed from the CD mode to a CS (Charge Sustaining) mode, with the result that HV traveling is mainly performed (as indicated by a dotted line). In the second embodiment, the possible EV traveling distance (distance indicated by the solid line) in the CD mode is calculated as the possible EV traveling distance by vehicle 1.

Turning back to FIG. 20, in S550, terminal 4B determines whether or not the travel route traveled this time coincides with the registered route. When the travel route traveled this time is different from the registered route (NO in S550), it is determined that the possible EV traveling distance acquired by vehicle 1 this time is not appropriate to be used for comparison in S580 below, with the result that terminal 4B returns the process to the main routine. In this case, the series of processes will be performed again in future (for example, on the next day).

When the travel route traveled this time coincides with the registered route (YES in S550), terminal 4B advances the process to S560. Although details will be described later, terminal 4B calculates a slope θy indicating a degree of decrease of the possible EV traveling distance. Further, from abnormality diagnosis database 330 provided in server 3, terminal 4B acquires a slope θx indicating a degree of decrease of the possible EV traveling distance in the case where battery pack 10 is normal (S570). Moreover, terminal 4B compares slope θx with slope θy (S580).

Figure 23:
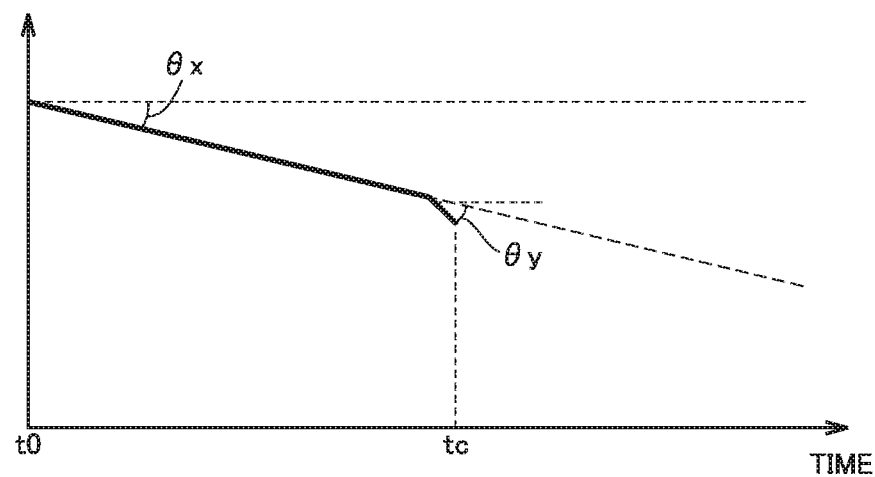
FIG. 23 illustrates an abnormality diagnosis method for the battery pack.

FIG. 23 illustrates the abnormality diagnosis method for the battery pack. In FIG. 23, the horizontal axis represents passage of time and the vertical axis represents the possible EV traveling distance.

The possible EV traveling distance in the above-described registered route is calculated regularly (for example, every half a year or every year). Even though the capacity restoration process (process of S510) is performed, as the deterioration of battery pack 10 is advanced, the possible EV traveling distance is decreased from the state (see time t0) of battery pack 10 in which battery pack 10 is new. This degree of decrease is indicated by the slope of the straight line on FIG. 23. When battery pack 10 is normal, the possible EV traveling distance is decreased at a pace of slope θx.

On the other hand, it is assumed that when the slope of the straight line is calculated based on the possible EV traveling distance acquired from vehicle 1 this time (see time t0), the slope is θy smaller than θx. In this case, it is considered that a certain abnormality has occurred in battery pack 10 in a period of time from the previous measurement to the present measurement.

Turning back to FIG. 20, when the difference between slope θx and slope θy is not less than a reference value (YES in S580), terminal 4B determines that a certain abnormality has occurred in battery pack 10 and controls display 42 to present so (S590). On the other hand, when the difference between slope θx and slope θy is less than the reference value (NO in S580), terminal 4B determines that battery pack 10 is normal and controls display 42 to present so (S595).

FIG. 24 shows an exemplary message presented on display 42 when it is determined that an abnormality has occurred in battery pack 10. As shown in FIG. 24, display 42 presents a message that recommends inspection of vehicle 1 to the user because it is considered that an abnormality has occurred in battery pack 10.

Further, display 42 presents: a ratio of an actually measured EV traveling distance (a ratio of a possible EV traveling distance at the time of measurement to a possible EV traveling distance in the case where battery pack 10 is new); and a ratio of a possible EV traveling distance assumed in the case where the deterioration of battery pack 10 is advanced in a normal manner. Since the possible EV traveling distance in the case where battery pack 10 was new in the past is used for the purpose of comparison, the degree of advance of deterioration of battery pack 10 can be notified to the user in an understandable manner.

As described above, according to the second embodiment, the possible EV traveling distance is calculated regularly, for example, every half a year or every year with regard to the travel route (registered route) registered in advance. By performing "fixed point observation of the possible EV traveling distance" in this way, the degree of decrease of the possible EV traveling distance at present can be compared with that in past. When the possible EV traveling distance is decreased remarkably as compared with the past history as a result of the comparison, it is highly likely that a certain abnormality has occurred. Therefore, terminal 4B recommends inspection of vehicle 1 to the user. Accordingly, the user hands over vehicle 1 to a dealer or the like and the dealer or the like closely inspects the state of battery pack 10, whereby whether or not there is an abnormality in battery pack 10 can be diagnosed more accurately. Moreover, when there is an abnormality in battery pack 10, the location of the abnormality can be specified.

Further, when the user considers replacement of battery pack 10 as a result of the inspection at the dealer, the battery information of battery pack 10 is acquired in the same manner as in the first embodiment so as to determine an appropriate battery pack for replacement.

Although the embodiments of the present disclosure have been described, the embodiments disclosed herein are illustrative and non-restrictive in any respect. The scope of the present disclosure is defined by the terms of the claims, and is intended to include any modifications within the scope and meaning equivalent to the terms of the claims.

What is claimed is:

1. A battery replacement assisting system for assisting replacement of a secondary battery mounted in a vehicle, the battery replacement assisting system comprising:

a terminal including a console configured to accept an operation of a user with regard to a planned time of stopping use of a target vehicle;

a server configured to determine, from a plurality of secondary batteries including a recycled secondary battery, a secondary battery serving as a replacement candidate for a target battery mounted on the target vehicle, the recycled secondary battery being provided with a lower rank as deterioration of the recycled secondary battery is more advanced, the server having deterioration information and expense information, the deterioration information being about a state of deterioration of each of the plurality of secondary batteries, the expense information being about an expense for replacement with each of the plurality of secondary batteries, the expense information defining the expense according to the rank of the recycled secondary battery, the server being configured to communicate with the terminal, the server being configured to acquire a state of deterioration of the target battery, select a secondary battery having a life longer than a period until the planned time from the plurality of secondary batteries by calculating a life of the target battery representing at least one of a distance and a period in each of which the target vehicle is capable of traveling until the target battery reaches a predetermined state of deterioration, select, from the plurality of secondary batteries, a secondary battery having a lowest rank of ranks of secondary batteries each having a life longer than the period until the planned time, and determine the replacement candidate using a result of the selection and the expense information, and a notifier configured to notify the user of the replacement candidate determined by the server and the expense information of the replacement candidate.

2. The battery replacement assisting system according to claim 1, wherein the notifier is configured to notify the user of the secondary battery selected by the server and the expense information of the secondary battery selected by the server.

3. The battery replacement assisting system according to claim 2, wherein
the console is configured to permit the user to select one of a new secondary battery and the recycled secondary battery as the replacement candidate, and
the server is configured to select the secondary battery having the lowest rank when the user selects the recycled secondary battery.

4. The battery replacement assisting system according to claim 2, wherein the server is configured to select a secondary battery having a second lowest rank when the server does not have information about the secondary battery having the lowest rank.

5. The battery replacement assisting system according to claim 2, wherein
the target vehicle is a hybrid vehicle configured to perform
HV traveling in which the target vehicle travels by an internal combustion engine combusting fuel, and
EV traveling in which the target vehicle travels using power stored in the target battery, and
the server is configured to calculate, as the expense information of the replacement candidate, an expense of the fuel that is able to be saved by the replacement of the target battery, and further transmit a result of the calculation to the notifier.

6. A server,
wherein the server is configured to determine, from a plurality of secondary batteries including a recycled secondary battery, a secondary battery serving as a replacement candidate for a target battery mounted on a target vehicle, the secondary battery serving as the replacement candidate being determined using a planned time of stopping use of the target vehicle, the planned time being input by a user, the server being configured to provide a result of the determination to the user, the recycled secondary battery being provided with a lower rank as deterioration of the recycled secondary battery is more advanced, the server comprising:
a storage device having deterioration information and expense information, the deterioration information being about a state of deterioration of each of the plurality of secondary batteries, the expense information being about an expense for replacement with each of the plurality of secondary batteries, the expense information defining the expense according to the rank of the recycled secondary battery;
a calculation device configured to
acquire a state of deterioration of the target battery,
select a secondary battery having a life longer than a period until the planned time from the plurality of secondary batteries by calculating a life of the target battery representing at least one of a distance and a period in each of which the target vehicle is capable of traveling until the target battery reaches a predetermined state of deterioration,
select, from the plurality of secondary batteries, a secondary battery having a lowest rank of ranks of secondary batteries each having a life longer than the period until the planned time, and
determine the replacement candidate using a result of the selection and the expense information; and
a communication device configured to notify the user of the replacement candidate determined by the calculation device and the expense information of the replacement candidate.

* * * * *